(12) United States Patent
Choi et al.

(10) Patent No.: US 12,439,774 B2
(45) Date of Patent: Oct. 7, 2025

(54) DISPLAY PANEL WITH A REPAIR CIRCUIT

(71) Applicant: Samsung Display Co., Ltd., Yongin-Si (KR)

(72) Inventors: Jieun Choi, Seoul (KR); Yongsung Park, Seoul (KR); Nam-Hyun Kim, Yongin-si (KR); Youhan Moon, Bucheon-si (KR); Sungwoo Jung, Cheonan-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 583 days.

(21) Appl. No.: 17/878,170

(22) Filed: Aug. 1, 2022

(65) Prior Publication Data

US 2023/0171997 A1 Jun. 1, 2023

(30) Foreign Application Priority Data

Nov. 26, 2021 (KR) ........................ 10-2021-0165610

(51) Int. Cl.
*H01L 21/78* (2006.01)
*H10D 30/67* (2025.01)
*H10K 59/121* (2023.01)
*H10K 59/131* (2023.01)

(52) U.S. Cl.
CPC ..... *H10K 59/1213* (2023.02); *H10D 30/6723* (2025.01); *H10D 30/6743* (2025.01); *H10D 30/6755* (2025.01); *H10K 59/1216* (2023.02); *H10K 59/131* (2023.02)

(58) Field of Classification Search
CPC ........... H10K 59/1213; H10K 59/1216; H10K 59/131; H10K 71/861; H10K 59/121; H10K 59/124; H10D 30/6723; H10D 30/6743; H10D 30/6755; H10D 86/423; H10D 86/60; G09G 2330/08
USPC ........................................................ 257/200
See application file for complete search history.

(56) References Cited

U.S. PATENT DOCUMENTS

| | | | |
|---|---|---|---|
| 9,443,466 B2 * | 9/2016 | In .......................... | G09G 3/3233 |
| 9,679,508 B2 * | 6/2017 | Park ....................... | G09G 3/3266 |
| 9,911,799 B2 | 3/2018 | Cho et al. | |
| 10,204,975 B2 * | 2/2019 | Kang ...................... | G09G 3/3225 |
| 10,789,881 B2 * | 9/2020 | Park ....................... | G09G 3/3225 |

(Continued)

FOREIGN PATENT DOCUMENTS

| | | |
|---|---|---|
| KR | 10-1581368 B1 | 12/2015 |
| KR | 10-2021-0083944 A | 7/2021 |

*Primary Examiner* — Vu A Vu
(74) *Attorney, Agent, or Firm* — Innovation Counsel LLP

(57) ABSTRACT

A display panel includes a base layer including a display area and a non-display area, a repair circuit disposed in the non-display area, a pixel disposed in the display area and including a pixel circuit and a light emitting element electrically connected to the pixel circuit, and a repair line electrically connecting the repair circuit to the pixel. The pixel circuit includes a silicon transistor including a silicon semiconductor pattern and a first gate disposed on the silicon semiconductor pattern, an oxide transistor including a light shielding pattern disposed on the first gate and disposed on the same layer as the repair line, an oxide semiconductor pattern disposed on the light shielding pattern, and a second gate disposed on the oxide semiconductor pattern, and a bridge electrode electrically connected to the light emitting element and the silicon transistor.

20 Claims, 11 Drawing Sheets

(56) References Cited

U.S. PATENT DOCUMENTS

| | | |
|---|---|---|
| 11,049,439 B2 | 6/2021 | Lo et al. |
| 11,587,998 B2* | 2/2023 | Lee ...................... H10K 59/131 |
| 2020/0350464 A1* | 11/2020 | Shin .................. H10D 30/6723 |
| 2021/0050403 A1* | 2/2021 | Lee ........................ H10K 71/00 |
| 2022/0157914 A1* | 5/2022 | Kim ..................... H10K 59/131 |
| 2022/0171484 A1* | 6/2022 | Lee ..................... G06F 3/04164 |
| 2022/0208925 A1* | 6/2022 | Park .................. H10K 59/1213 |

* cited by examiner

FIG. 5

DISPLAY PANEL WITH A REPAIR CIRCUIT

This U.S. non-provisional patent application claims priority under 35 U.S.C. § 119 of Korean Patent Application No. 10-2021-0165610, which was filed on Nov. 26, 2021, the content of which is hereby incorporated by reference in its entirety.

BACKGROUND

1. Field of Disclosure

The present disclosure relates to a display panel. More particularly, the present disclosure relates to a display panel in which defective pixels are repaired.

2. Description of the Related Art

A display panel includes pixels for displaying images. Each pixel includes a pixel driving circuit and a light emitting element connected to the pixel driving circuit. The pixel driving circuit includes at least one thin film transistor and a capacitor. The thin film transistor and the capacitor of the pixel driving circuit control the light emitting element in response to electrical signals from an external source.

SUMMARY

The present disclosure provides a display panel with improved yield of a repair process with respect to defective pixels.

Embodiments of the inventive concept provide a display panel including a base layer including a display area and a non-display area, a repair circuit disposed in the non-display area, a pixel disposed in the display area and including a pixel circuit and a light emitting element electrically connected to the pixel circuit, and a repair line electrically connected to the repair circuit and extending from the repair circuit to the pixel. The pixel circuit includes a silicon transistor including a silicon semiconductor pattern including a first input area, a first channel area, and a first output area and a first gate disposed on the silicon semiconductor pattern and overlapping the first channel area, an oxide transistor including a light shielding pattern disposed on the first gate and disposed on a same layer as a layer on which the repair line is disposed, an oxide semiconductor pattern disposed on the light shielding pattern and including a second input area, a second channel area, and a second output area, and a second gate disposed on the oxide semiconductor pattern and overlapping the second channel area, and a bridge electrode disposed on a same layer as a layer on which the second gate is disposed, overlapping the repair line, and electrically connected to the light emitting element and the silicon transistor.

The display panel further includes a first connection electrode disposed on the second gate, connected to the first output area of the silicon transistor and the bridge electrode, and electrically connected to the light emitting element.

The display panel further includes a second connection electrode disposed on the first connection electrode and connected to the first connection electrode and the light emitting element.

The display panel further includes first, second, third, fourth, and fifth insulating layers sequentially disposed on the base layer. The silicon semiconductor pattern of the silicon transistor is disposed between the base layer and the first insulating layer, the first gate of the silicon transistor is disposed between the first and second insulating layers, each of the light shielding pattern and the repair line of the oxide transistor is disposed between the second and third insulating layers, the oxide semiconductor pattern of the oxide transistor is disposed between the third and fourth insulating layers, each of the second gate of the oxide transistor and the bridge electrode is disposed between the fourth and fifth insulating layers, and the first connection electrode is disposed on the fifth insulating layer and is connected to the bridge electrode via a contact hole in the fifth insulating layer.

The light shielding pattern includes a metal layer, and the light shielding pattern is electrically connected to the second gate.

The repair circuit includes a repair transistor having a same stack structure as a stack structure of the silicon transistor.

The repair circuit further includes a sub-bridge electrode disposed on a same layer as a layer on which the second gate is disposed and electrically connected to the repair line and the repair transistor.

Each of the pixel, the repair circuit, and the repair line is provided in plural, the pixels are arranged in a first direction and a second direction crossing the first direction, the repair circuits are arranged in one of the first and second directions, and each of the repair lines extends from a corresponding repair circuit among the repair circuits to the other of the first and second directions.

In another aspect, the inventive concept provides a display panel including a base layer including a display area and a non-display area, a first pixel disposed in the display area and including a first pixel circuit and a first light emitting element electrically connected to the first pixel circuit, a second pixel disposed in the display area and including a second pixel circuit including a disconnection area and a second light emitting element, a repair circuit disposed in the non-display area, and a repair line electrically connected to the repair circuit and extending from the repair circuit to the second pixel. The second pixel circuit includes a silicon transistor including a silicon semiconductor pattern including a first input area, a first channel area, and a first output area and a first gate disposed on the silicon semiconductor pattern and overlapping the first channel area, an oxide transistor including a light shielding pattern disposed on the first gate and disposed on a same layer as a layer on which the repair line is disposed, an oxide semiconductor pattern disposed on the light shielding pattern and including a second input area, a second channel area, and a second output area, and a second gate disposed on the oxide semiconductor pattern and overlapping the second channel area, and a bridge electrode disposed on a same layer as a layer on which the second gate is disposed and electrically connected to the second light emitting element. The repair line is connected to the bridge electrode to electrically connect the second light emitting element and the repair circuit.

The first output area of the silicon transistor supplying a driving current to the second light emitting element includes the disconnection area.

The first input area of the silicon transistor supplying the driving current to the second light emitting element includes the disconnection area.

The first input area of the silicon transistor supplying an initialization voltage to an anode of the second light emitting element includes the disconnection area.

The second pixel circuit further includes a storage capacitor connected between a first voltage line receiving a first power supply voltage and a reference node, the silicon transistor includes a first transistor connected between the first voltage line and the second light emitting element, a second transistor connected between a data line and a first input area of the first transistor, a fifth transistor connected between the first voltage line and the first input area of the first transistor, a sixth transistor connected between the second light emitting element and a first output area of the first transistor, a seventh transistor connected between a third voltage line receiving a second initialization voltage and the second light emitting element, and an eighth transistor connected between a fourth voltage line receiving a third initialization voltage and the first input area of the first transistor. The oxide transistor includes a third transistor connected between the reference node and the first output area of the first transistor and a fourth transistor connected between the reference node and a second voltage line receiving a first initialization voltage, and the disconnection area is defined between the sixth transistor and the second light emitting element and between the seventh transistor and the second light emitting element.

The repair circuit includes a sub-pixel circuit having a circuit equivalent to a pixel circuit to which the disconnection area of the second pixel circuit is connected.

The repair circuit includes a sub-storage capacitor connected between a first voltage line receiving a first power supply voltage and a reference node, a first sub-transistor connected between the first voltage line and the repair line, a second sub-transistor connected between a data line and a first input area of the first sub-transistor, a third sub-transistor connected between the reference node and a first output area of the first sub-transistor, a fourth sub-transistor connected between the reference node and a second voltage line receiving a first initialization voltage, a fifth sub-transistor connected between the first voltage line and the first input area of the first sub-transistor, a sixth sub-transistor connected between the repair line and the first output area of the first sub-transistor, a seventh sub-transistor connected between a third voltage line receiving a second initialization voltage and the repair line, and an eight sub-transistor connected between a fourth voltage line receiving a third initialization voltage and the first input area of the first sub-transistor.

The repair circuit further includes a holding capacitor connected between the first voltage line and a first input area of the seventh sub-transistor and a ninth sub-transistor connected between a first output area of the sixth sub-transistor and the first input area of the seventh sub-transistor.

The display panel further includes a first connection electrode disposed on the second gate, connected to the first output area of the silicon transistor and the bridge electrode, and electrically connected to the second light emitting element and a second connection electrode disposed on the first connection electrode and connected to the first connection electrode and the second light emitting element.

The display panel further includes first, second, third, fourth, and fifth insulating layers sequentially disposed on the base layer. The silicon semiconductor pattern of the silicon transistor is disposed between the base layer and the first insulating layer and the first gate of the silicon transistor is disposed between the first and second insulating layers. Each of the light shielding pattern and the repair line of the oxide transistor is disposed between the second and third insulating layers, the oxide semiconductor pattern of the oxide transistor is disposed between the third and fourth insulating layers, each of the second gate of the oxide transistor and the bridge electrode is disposed between the fourth and fifth insulating layers, and a first connection electrode is disposed on the fifth insulating layer and is connected to the bridge electrode via a contact hole in the fifth insulating layer.

In yet another aspect, the inventive concept provides a display panel including a base layer including a display area and a non-display area, a repair circuit disposed in the non-display area, a pixel disposed in the display area and including a pixel circuit and a light emitting element, and a repair line electrically connected to the repair circuit and extending from the repair circuit to the pixel. The pixel circuit includes a silicon transistor including a silicon semiconductor pattern including a first input area, a first channel area, and a first output area and a first gate disposed on the silicon semiconductor pattern and overlapping the first channel area, an oxide transistor including a light shielding pattern disposed on the first gate, an oxide semiconductor pattern disposed on the light shielding pattern and including a second input area, a second channel area, and a second output area, and a second gate disposed on the oxide semiconductor pattern, overlapping the second channel area, and disposed on a same layer as a layer on which the repair line is disposed, and a connection electrode disposed on the second gate, overlapping the repair line, connected to the first output area of the silicon transistor, and electrically connected to the light emitting element. The light emitting element is electrically connected to the silicon transistor of the pixel circuit or electrically connected to the repair circuit.

The repair line is connected to the connection electrode when the light emitting element is electrically connected to the repair circuit.

According to the above, the display panel includes a pixel driving circuit and the repair circuit. A defective pixel including a defective pixel driving circuit normally emits a light after the repair process that electrically connects the repair circuit to a light emitting element of the defective pixel.

According to the above, a yield of the repair process with respect to the defective pixel is improved, and thus, a reliability of the display panel is improved.

BRIEF DESCRIPTION OF THE DRAWINGS

The above and other advantages of the present disclosure will become readily apparent by reference to the following detailed description when considered in conjunction with the accompanying drawings wherein:

FIG. 5 is an equivalent circuit diagram of a pixel and a repair circuit according to an embodiment of the present disclosure;

DETAILED DESCRIPTION

Figure 1:
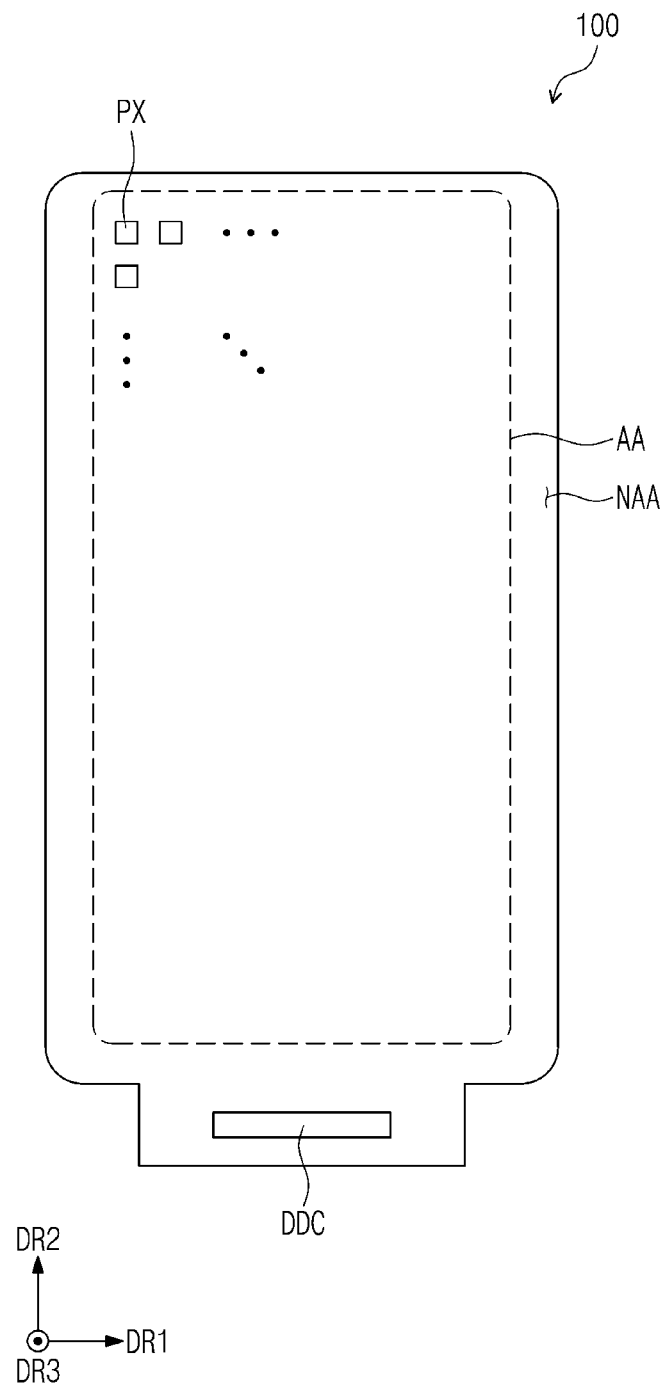
FIG. 1 is a plan view of a display panel according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

Figure 2:
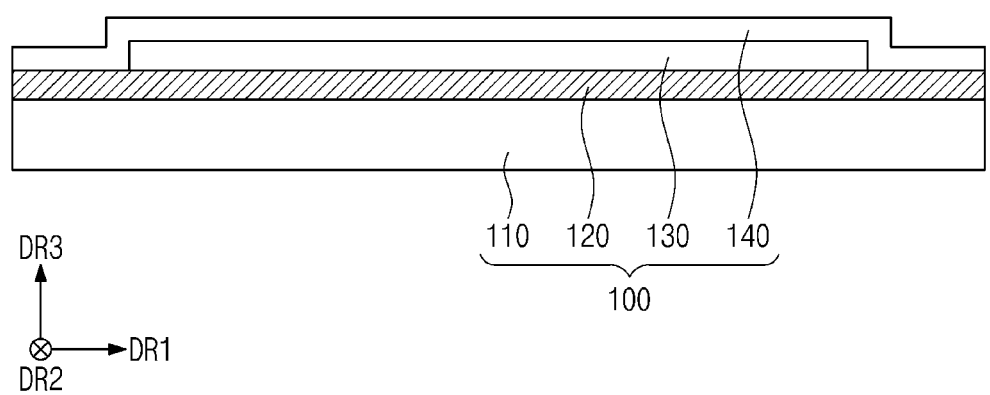
FIG. 2 is a cross-sectional view of a display panel according to an embodiment of the present disclosure.

FIG. 1 is a plan view of a display panel 100 according to an embodiment of the present disclosure, and FIG. 2 is a cross-sectional view of the display panel 100 according to an embodiment of the present disclosure.

Referring to FIG. 1, the display panel 100 may include a display area AA and a non-display area NAA. A pixel PX may be disposed in the display area AA but not in the non-display area NAA. The non-display area NAA may be adjacent to the display area AA and may surround at least a portion of the display area AA. A data driving circuit DDC (refer to FIG. 3A) may be disposed at one side portion of the non-display area NAA.

The display area AA may include a plane defined by a first direction DR1 and a second direction DR2. A thickness direction of the display panel 100 may be substantially parallel to a third direction DR3, i.e., a direction that is orthogonal to the plane of the display area AA. Front (or upper) and rear (or lower) surfaces of each member of the display panel 100 may be defined with respect to the third direction DR3.

The display panel 100 may be a light emitting type display panel. For example, the display panel 100 may be an organic light emitting display panel, an inorganic light emitting display panel, a quantum dot display panel, a micro-LED display panel, or a nano-LED display panel. The display panel 100 may be flexible. Although not shown in figures, the display panel 100 may be folded with respect to at least one folding axis. The folding area may cross the display area AA.

Referring to FIG. 2, the display panel 100 may include a base layer 110, a circuit layer 120, a light emitting element layer 130, and an encapsulation layer 140. According to an embodiment, another functional layer may be further disposed between two adjacent layers among the base layer 110, the circuit layer 120, the light emitting element layer 130, and the encapsulation layer 140.

The base layer 110 may provide a base surface on which the circuit layer 120 is disposed. The base layer 110 may be a flexible substrate that is bendable, foldable, or rollable. The base layer 110 may be a glass substrate, a metal substrate, or a polymer substrate, however, it should not be limited thereto or thereby. According to an embodiment, the base layer 110 may be an inorganic layer, an organic layer, or a composite material layer.

The base layer 110 may have a multi-layer structure. For instance, the base layer 110 may include a first synthetic resin layer, an inorganic layer having a single-layer or multi-layer structure, and a second synthetic resin layer disposed on the inorganic layer having a single-layer or multi-layer structure. Each of the first and second synthetic resin layers may include a polyimide-based resin; however, this is not a requirement.

The circuit layer 120 may be disposed on the base layer 110. The circuit layer 120 may include an insulating layer, a semiconductor pattern, a conductive pattern, a signal line, and a repair line.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and any foreign substance such as dust particles. The encapsulation layer 140 may include at least one inorganic layer. The encapsulation layer 140 may include a stack structure in which an inorganic layer, an organic layer, and an inorganic layer are sequentially stacked.

Figure 3A:
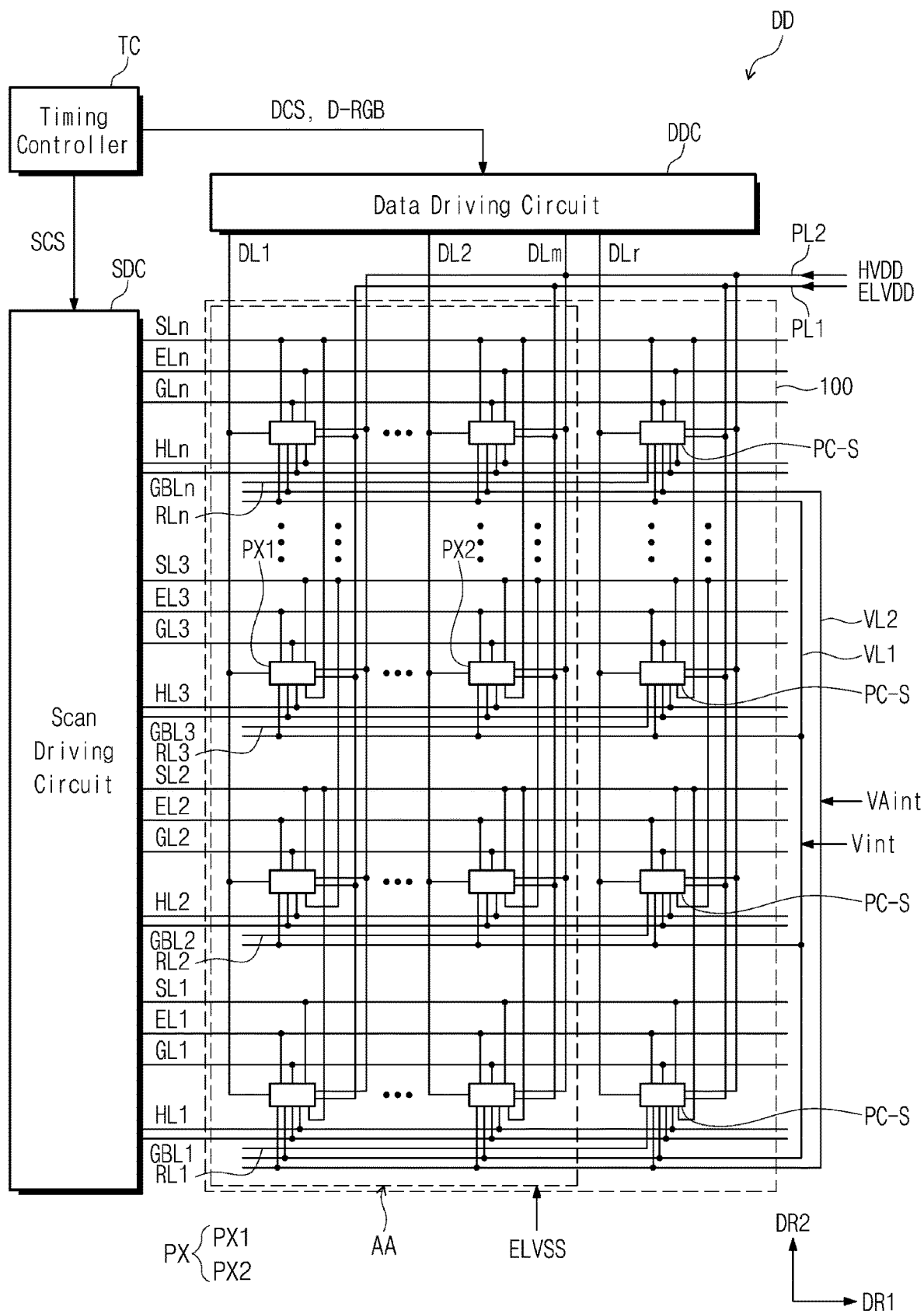
FIG. 3A is a schematic diagram of a display device according to an embodiment of the present disclosure.
Figure 3B:
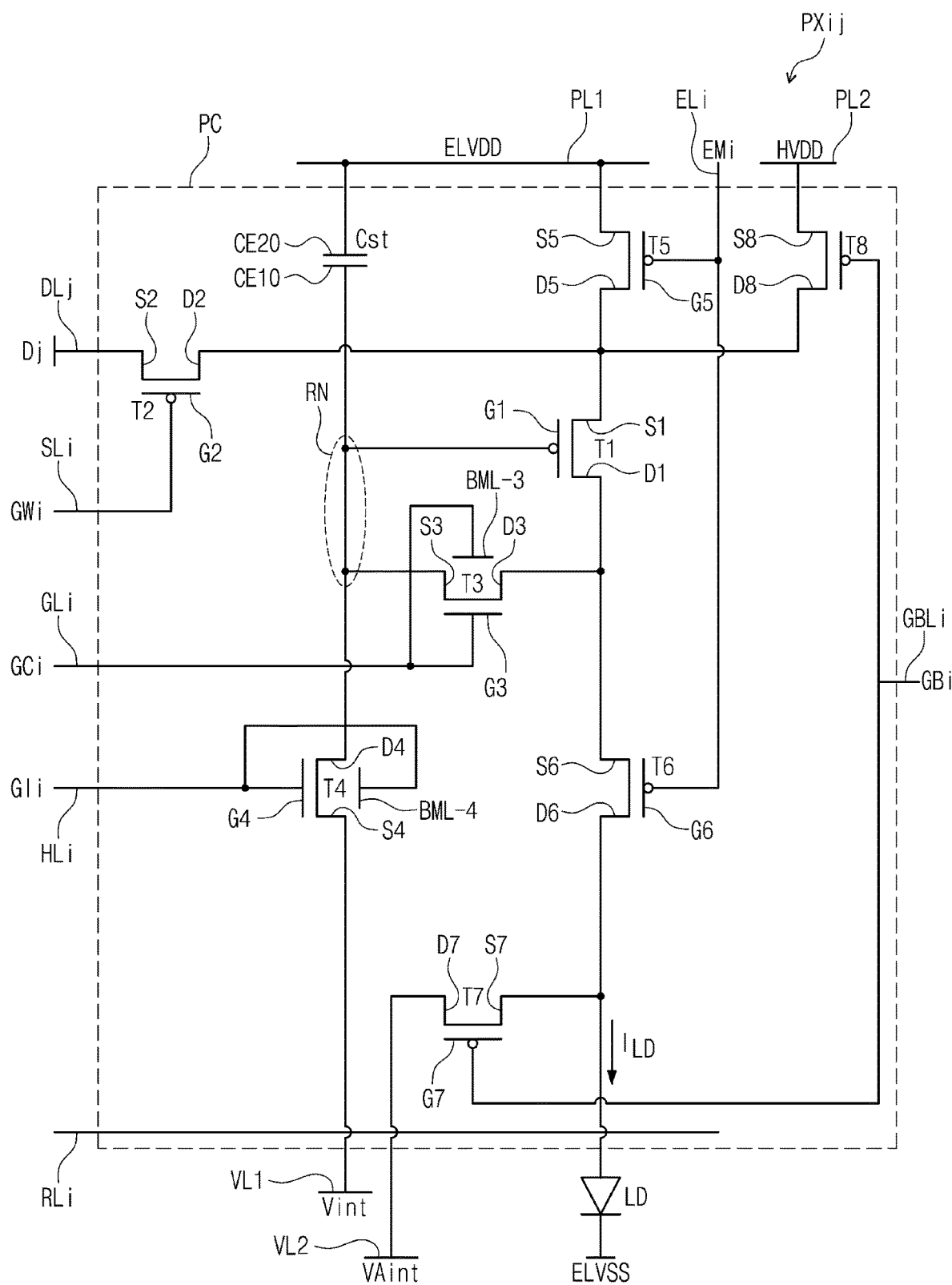
FIG. 3B is an equivalent circuit diagram of a pixel according to an embodiment of the present disclosure.
Figure 3C:
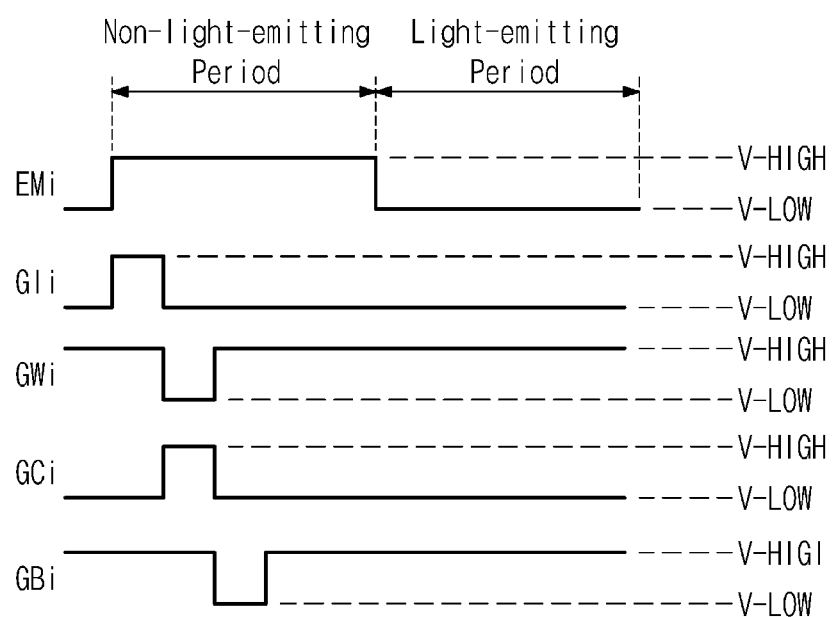
FIG. 3C is a waveform diagram of driving signals used to drive a pixel according to an embodiment of the present disclosure.

FIG. 3A is a schematic diagram of a display device DD according to an embodiment of the present disclosure. FIG. 3B is an equivalent circuit diagram of a pixel PXij according to an embodiment of the present disclosure. FIG. 3C is a waveform diagram of driving signals used to drive the pixel PXij according to an embodiment of the present disclosure.

Referring to FIG. 3A, the display device DD may be a device that is activated in response to electrical signals and displays an image. For example, the display device DD may be a tablet computer, a mobile phone, a car navigation unit, a game unit, or a wearable device; however, it should not be limited thereto or thereby.

The display device DD may include the display panel 100 described with reference to FIG. 2. The display panel 100 may have a configuration that substantially generates the image, and the display device DD may display the image generated by the display panel 100.

The display device DD may include a timing controller TC, a scan driving circuit SDC, the data driving circuit DDC, and the display panel 100. At least one of the timing controller TC, the scan driving circuit SDC, and the data driving circuit DDC may be provided in the form of a driving chip or may be directly formed in the display panel 100.

The timing controller TC may receive input image signals, may convert a data format of the input image signals to a data format appropriate to an interface between the timing controller TC and the scan driving circuit SDC, and may generate image data D-RGB. The timing controller TC may output the image data D-RGB and various control signals DCS and SCS.

The scan driving circuit SDC may receive a scan control signal SCS from the timing controller TC. The scan control signal SCS may include a vertical start signal to start an operation of the scan driving circuit SDC and a clock signal to determine an output timing of signals. The scan driving circuit SDC may generate a plurality of scan signals and may sequentially output the scan signals to corresponding signal lines SL1 to SLn, GL1 to GLn, HL1 to HLn, and GBL1 to GBLn. In addition, the scan driving circuit SDC may generate a plurality of light emitting control signals in response to the scan control signal SCS and may output the light emitting control signals to corresponding light emitting lines EL1 to ELn.

In FIG. 3A, the scan signals and the light emitting control signals are output from one scan driving circuit SDC, but they should not be limited thereto or thereby. For example, the scan driving circuit SDC may be provided in plural, and the plural scan driving circuits may divide and output the scan signals, and the scan driving circuits may divide and output the light emitting control signals. According to an embodiment, a driving circuit generating and outputting the scan signals and a driving circuit generating and outputting the light emitting control signals may be separately implemented from each other.

The data driving circuit DDC may receive a data control signal DCS and the image data D-RGB from the timing controller TC. The data driving circuit DDC may convert the image data D-RGB to data signals and may output the data signals to a plurality of data lines DL1 to DLm and a sub-data line DLr described below. The data signals may be analog voltages corresponding to grayscale values of the image data D-RGB.

The display panel 100 may include a plurality of groups of signal lines. When one of the plural groups of signal lines is defined as a first signal line, another may be defined as a second signal line, and the other may be defined as a third signal line. Hereinafter, names of the signal lines are defined to distinguish the plural groups of signal lines from each other.

The plural groups of signal lines may include a first group of scan lines SL1 to SLn, a second group of scan lines GL1 to GLn, a third group of scan lines HL1 to HLn, a fourth group of scan lines GBL1 to GBLn, the light emitting lines EL1 to ELn, the data lines DL1 to DLm, the sub-data line DLr, a first voltage line PL1, a second voltage line VL1, a third voltage line VL2, and a fourth voltage line PL2.

The first group of scan lines SL1 to SLn, the second group of scan lines GL1 to GLn, the third group of scan lines HL1 to HLn, the fourth group of scan lines GBL1 to GBLn, and the light emitting lines EL1 to ELn may extend in the first direction DR1 and may be arranged in the second direction DR2 crossing the first direction DR1. The data lines DL1 to DLm and the sub-data line DLr may be insulated from the first group of scan lines SL1 to SLn, the second group of scan lines GL1 to GLn, the third group of scan lines HL1 to HLn, the fourth group of scan lines GBL1 to GBLn, and the light emitting lines EL1 to ELn while crossing the first group of scan lines SL1 to SLn, the second group of scan lines GL1 to GLn, the third group of scan lines HL1 to HLn, the fourth group of scan lines GBL1 to GBLn, and the light emitting lines EL1 to ELn.

Each of the first voltage line PL1, the second voltage line VL1, the third voltage line VL2, and the fourth voltage line PL2 may include at least one of a component extending in the first direction DR1 and a component extending in the second direction DR2. Each of the first voltage line PL1, the second voltage line VL1, the third voltage line VL2, and the fourth voltage line PL2 may include a component extending in the first direction DR1 and a component extending in the second direction DR2. The structure and the shape of the first voltage line PL, the second voltage line VL1, the third voltage line VL2, and the fourth voltage line PL2 may be independent of one another.

Each of pixels PX may be connected to a corresponding signal line among the signal lines. A connection relationship between the pixels PX and the signal lines may be changed depending on a configuration of a driving circuit of the pixels PX.

The first voltage line PL1 may receive a first power supply voltage ELVDD. The display panel 100 may receive a second power supply voltage ELVSS. The second power supply voltage ELVSS may have a level lower than that of the first power supply voltage ELVDD. According to the present disclosure, the second power supply voltage ELVSS may be applied to the driving circuit of the pixels PX.

The second voltage line VL1 may receive a first initialization voltage Vint. The first initialization voltage Vint may have a level lower than that of the first power supply voltage ELVDD. The third voltage line VL2 may receive a second initialization voltage VAint. The second initialization voltage VAint may have a level lower than that of the first power supply voltage ELVDD. The first initialization voltage Vint and the second initialization voltage VAint may be a bias voltage with a constant level. The first initialization voltage Vint and the second initialization voltage VAint may have different levels from each other. The second initialization voltage VAint may have a level lower than that of the first initialization voltage Vint.

The fourth voltage line PL2 may receive a third initialization voltage HVDD. The third initialization voltage HVDD may have the same level as that of the first power supply voltage EVLDD, however, it should not be limited thereto or thereby. According to an embodiment, the third initialization voltage HVDD may have a level lower than that of the first power supply voltage EVLDD.

According to the present embodiment, the display device DD may include the pixels PX, a plurality of repair circuits PC-S, and a plurality of repair lines RL1 to RLn.

The pixels PX may be arranged in the display area AA. The pixels PX may be arranged in the first direction DR1 and the second direction DR2. The pixels PX may include a plurality of pixel rows extending in the first direction DR1 and arranged in the second direction DR2 and a plurality of pixel columns extending in the second direction DR2 and arranged in the first direction DR1.

The pixels PX may include a plurality of groups that generates color lights different from each other. For instance, the pixels PX may include red pixels generating a red light, green pixels generating a green light, and blue pixels generating a blue light. A light emitting element of the red pixel, a light emitting element of the green pixel, and a light emitting element of the blue pixel may include light emitting layers containing different materials from each other.

According to the present embodiment, the pixels PX may include a first pixel PX1 and a second pixel PX2. In the present disclosure, the first pixel PX1 may be referred to as a normal pixel, and the second pixel PX2 may be referred to as a defective pixel.

The first pixel PX1 may include a first pixel circuit and a first light emitting element. The first light emitting element may be electrically connected to the first pixel circuit. In the present disclosure, the first pixel circuit may be defined as a circuit that normally supplies a driving current to the first light emitting element.

The second pixel PX2 may include a second pixel circuit and a second light emitting element. In the present disclosure, the second pixel circuit may be defined as a circuit that has a defect in providing the driving current to the second light emitting element. According to an embodiment, the second pixel circuit may include a disconnection area. Accordingly, the second light emitting element may be electrically disconnected from the second pixel circuit. This will be described in detail below.

The repair circuits PC-S may be disposed in the non-display area NAA (refer to FIG. 1). As an example, the repair circuits PC-S may be disposed adjacent to a boundary between the display area AA and the non-display area NAA.

The repair circuits PC-S may be arranged in the first direction DR1 along an outermost pixel row or may be arranged in the second direction DR2 along an outermost pixel column. FIG. 3A shows the repair circuits PC-S arranged in the second direction DR2 as a representative example. Hereinafter, the structure in which the repair circuits PC-S are arranged in the second direction DR2 will be described as a representative example.

Each of the repair lines RL1 to RLn may extend from a corresponding repair circuit among the repair circuits PC-S to the pixels PX. Each of the repair lines RL1 to RLn may extend in a direction opposite to the first direction DR1. That is, the repair lines RL1 to RLn may be arranged along the pixel rows, respectively.

According to the present disclosure, a repair process of the second pixel PX2 may be performed such that the second light emitting element LD2 of the second pixel PX2 emits light in the normal manner The pixels PX are not electrically connected to the repair lines RL1 to RLn before the repair process. However, in the second pixel PX2 may be electrically connected to a corresponding repair line during the repair lines RL1 to RLn. Accordingly, the second pixel PX2 may be driven by the corresponding repair circuit PC-S to operate normally. Details of the repair process will be described below.

FIG. 3B shows the pixel PXij connected to an i-th scan line SLi of the first group among the first group of scan lines SL1 to SLn and connected to a j-th data line DLj among the data lines DL1 to DLm as a representative example.

The pixel PXij shown in FIG. 3B may correspond to the first pixel PX1 or the second pixel PX2 to which the repair process is not applied. Hereinafter, for the convenience of explanation, a component corresponding to the first pixel circuit of the first pixel PX1 or the second pixel circuit of the second pixel PX2 will be described as a pixel circuit PC, and a component corresponding to the first light emitting element of the first pixel PX1 or the second light emitting element of the second pixel PX2 will be described as a light emitting element LD.

In the present embodiment, the pixel circuit PC may include first, second, third, fourth, fifth, sixth, seventh, and eighth transistors T1, T2, T3, T4, T5, T6, T7, and T8 and a storage capacitor Cst. The first transistor T1, the second transistor T2, the fifth transistor T5, the sixth transistor T6, the seventh transistor T7, and the eighth transistor T8 may be a P-type transistor, and the third transistor T3 and the fourth transistor T4 may be an N-type transistor. However, the first to eighth transistors T1 to T8 should not be limited thereto or thereby, and the first to eighth transistors T1 to T8 may be implemented in one of the P-type transistor and the N-type transistor.

Hereinafter, an input area (or an input electrode) of the P-type transistor will be described as a first input area, an input area of the N-type transistor will be described as a second input area, an output area of the P-type transistor will be described as a first output area, and an output area of the N-type transistor will be described as a second output area. In addition, a gate of the P-type transistor will be described as a first gate, and a gate of the N-type transistor will be described as a second gate. Meanwhile, at least one of the first to eighth transistors T1 to T8 may be omitted.

The first transistor T1 may be a driving transistor, and the second transistor T2 may be a switching transistor. The storage capacitor Cst may be connected between the first voltage line PL1 receiving the first power supply voltage ELVDD and a reference node RN. The storage capacitor Cst may include a first electrode CE10 electrically connected to the reference node RN and a second electrode CE20 electrically connected to the first voltage line PL.

The first transistor T1 may be electrically connected between the first voltage line PL1 and one electrode (for example, an anode) of the light emitting element LD. A first input area S1 of the first transistor T1 may be electrically connected to the first voltage line PL. In the following descriptions, the expression "a transistor is connected to a signal line" means that one of an input area, an output area, and a gate of the transistor is in direct contact with the signal line or is connected to the signal line via a connection electrode. In addition, the expression "a transistor is electrically connected to another transistor" means that one of an input area, an output area, and a gate of the transistor is in direct contact with one of an input area, an output area, and a gate of another transistor or is connected to one of an input area, an output area, and a gate of another transistor via a connection electrode. Another transistor may or may not be disposed between the first input area Si of the first transistor T1 and the first voltage line PL1.

A first output area D1 of the first transistor T1 may be electrically connected to the anode AE (refer to FIG. 4) of the light emitting element LD. Another transistor may or may not be disposed between the first output area D1 of the first transistor T1 and the anode AE of the light emitting element LD. A first gate G1 of the first transistor T1 may be electrically connected to the reference node RN.

The second transistor T2 may be connected between the j-th data line DLj and the first input area S1 of the first transistor T1. A first input area S2 of the second transistor T2 may be electrically connected to the j-th data line DLj, and a first output area D2 of the second transistor T2 may be electrically connected to the first input area S1 of the first transistor T1. In the present embodiment, a first gate G2 of the second transistor T2 may be electrically connected to the i-th scan line SLi of the first group.

The third transistor T3 may be connected between the reference node RN and the first output area D1 of the first transistor T1. A second input area D3 of the third transistor T3 may be electrically connected to the first output area D1 of the first transistor T1, and a second output area S3 of the third transistor T3 may be electrically connected to the reference node RN.

A light shielding pattern BML-3 and a second gate G3 of the third transistor T3 may be electrically connected to an i-th scan line GLi of the second group. The light shielding pattern BML-3 and the second gate G3 may correspond to the third transistor T3. FIG. 3B shows a structure in which the third transistor T3 includes the light shielding pattern BML-3 and the second gate G3, however, the present disclosure should not be limited thereto or thereby. According to another embodiment, the third transistor T3 may include only the second gate G3 without the light shielding pattern BML-3.

The fourth transistor T4 may be electrically connected between the reference node RN and the second voltage line VL1. A second input area D4 of the fourth transistor T4 may be electrically connected to the reference node RN, and a second output area S4 of the fourth transistor T4 may be electrically connected to the second voltage line VL1.

A light shielding pattern BML-4 and a second gate G4 of the fourth transistor T4 may be electrically connected to an i-th scan line HLi of the third group. The light shielding pattern BML-4 and the second gate G4 may correspond to the fourth transistor T4. FIG. 3B shows a structure in which the fourth transistor T4 includes the light shielding pattern BML-4 and the second gate G4, however, the present disclosure should not be limited thereto or thereby. According to an embodiment, the fourth transistor T4 may include only the second gate G4.

The fifth transistor T5 may be electrically connected between the first voltage line PL1 and the first input area S1 of the first transistor T1. A first input area S5 of the fifth transistor T5 may be electrically connected to the first voltage line PL, and a first output area D5 of the fifth transistor T5 may be electrically connected to the first input area Si of the first transistor T1. A first gate G5 of the fifth transistor T5 may be electrically connected to an i-th light emitting line ELi.

The sixth transistor T6 may be electrically connected between the first output area D1 of the first transistor T1 and the light emitting element LD. A first input area S6 of the sixth transistor T6 may be electrically connected to the first output area D1 of the first transistor T1, and a first output area D6 of the sixth transistor T6 may be electrically connected to the anode AE (refer to FIG. 4) of the light emitting element LD. A first gate G6 of the sixth transistor T6 may be electrically connected to the i-th light emitting line ELi. According to an embodiment, the first gate G6 of the sixth transistor T6 may be connected to a signal line different from a signal line to which the first gate G5 of the fifth transistor T5 is connected.

The seventh transistor T7 may be electrically connected between the first output area D6 of the sixth transistor T6 and the third voltage line VL2. A first input area S7 of the seventh transistor T7 may be electrically connected to the first output area D6 of the sixth transistor T6, and a first output area D7 of the seventh transistor T7 may be electrically connected to the third voltage line VL2. A first gate G7 of the seventh transistor T7 may be electrically connected to an i-th scan line GBLi of the fourth group.

The eighth transistor T8 may be electrically connected between the first input area S1 of the first transistor T1 and the fourth voltage line PL2. A first input area S8 of the eighth transistor T8 may be electrically connected to the fourth voltage line PL2, and a first output area D8 of the eighth transistor T8 may be electrically connected to the first input area S1 of the first transistor T1. A first gate G8 of the eighth transistor T8 may be electrically connected to the i-th scan line GBLi of the fourth group.

The operation of the pixel PXij will be described in more detail with reference to FIGS. 3B and 3C. The display device DD may display an image every frame period. The signal lines of each of the first group of scan lines SL1 to SLn, the second group of scan lines GL1 to GLn, the third group of scan lines HL1 to HLn, the fourth group of scan lines GBL1 to GBLn, and the light emitting lines EL1 to ELn may be sequentially scanned during each frame period. FIG. 3C shows a portion of one frame period.

Referring to FIG. 3C, each of signals EMi, GIi, GWi, GCi, and GBi may have a high level V-HIGH for a portion of the period and may have a low level V-LOW for another portion of the period. The N-type transistors may be turned on when a corresponding signal has the high level V-HIGH, and the P-type transistors may be turned on when a corresponding signal has the low level V-LOW.

When a light emitting control signal EMi has the high level V-HIGH, the fifth transistor T5 and the sixth transistor T6 may be turned off. When the fifth transistor T5 and the sixth transistor T6 are turned off, a current path may not be formed between the first voltage line PL1 and the light emitting element LD. Accordingly, the period during which the fifth transistor T5 and the sixth transistor T6 are turned off may be defined as a non-light-emitting period.

When a scan signal GIi applied to the i-th scan line HLi of the third group has the high level V-HIGH, the fourth transistor T4 may be turned on. When the fourth transistor T4 is turned on, the reference node RN may be initialized by the first initialization voltage Vint. When a scan signal GWi applied to the i-th scan line SLi of the first group has the low level V-LOW and a scan signal GCi applied to the i-th scan line GLi of the second group has the high level V-HIGH, the second transistor T2 and the third transistor T3 may be turned on.

Since the reference node RN is initialized to the first initialization voltage Vint, the first transistor T1 may be in a turned-on state. When the first transistor T1 is turned on, a voltage corresponding to a data signal Dj (refer to FIG. 3B) may be applied to the reference node RN. In this case, the storage capacitor Cst may be charged with the voltage corresponding to the data signal Dj. The voltage corresponding to the data signal Dj may be obtained by subtracting a threshold voltage Vth of the first transistor T1 from the data signal Dj.

When a scan signal GBi applied to the i-th scan line GBLi of the fourth group has the low level V-LOW, the eighth transistor T8 may be turned on. As the eighth transistor T8 is turned on, the first input area S1 of the first transistor T1 may be initialized to the third initialization voltage HVDD.

When the light emitting control signal EMi has the low level V-LOW, the fifth transistor T5 and the sixth transistor T6 may be turned on. When the fifth transistor T5 is turned on, the first power supply voltage ELVDD may be applied to the first transistor T1. When the sixth transistor T6 is turned on, the first transistor T1 and the light emitting element LD may be electrically connected to each other. The light emitting element LD may generate the light having luminance corresponding to a current amount applied thereto. The period during which the fifth transistor T5 and the sixth transistor T6 are turned on may be defined as a light-emitting period.

According to an embodiment, the scan signal GBi applied to the i-th scan line GBLi of the fourth group may additionally have the low level V-LOW before the scan signal GIi applied to the i-th scan line HLi of the third group has the high level V-HIGH.

Figure 4:
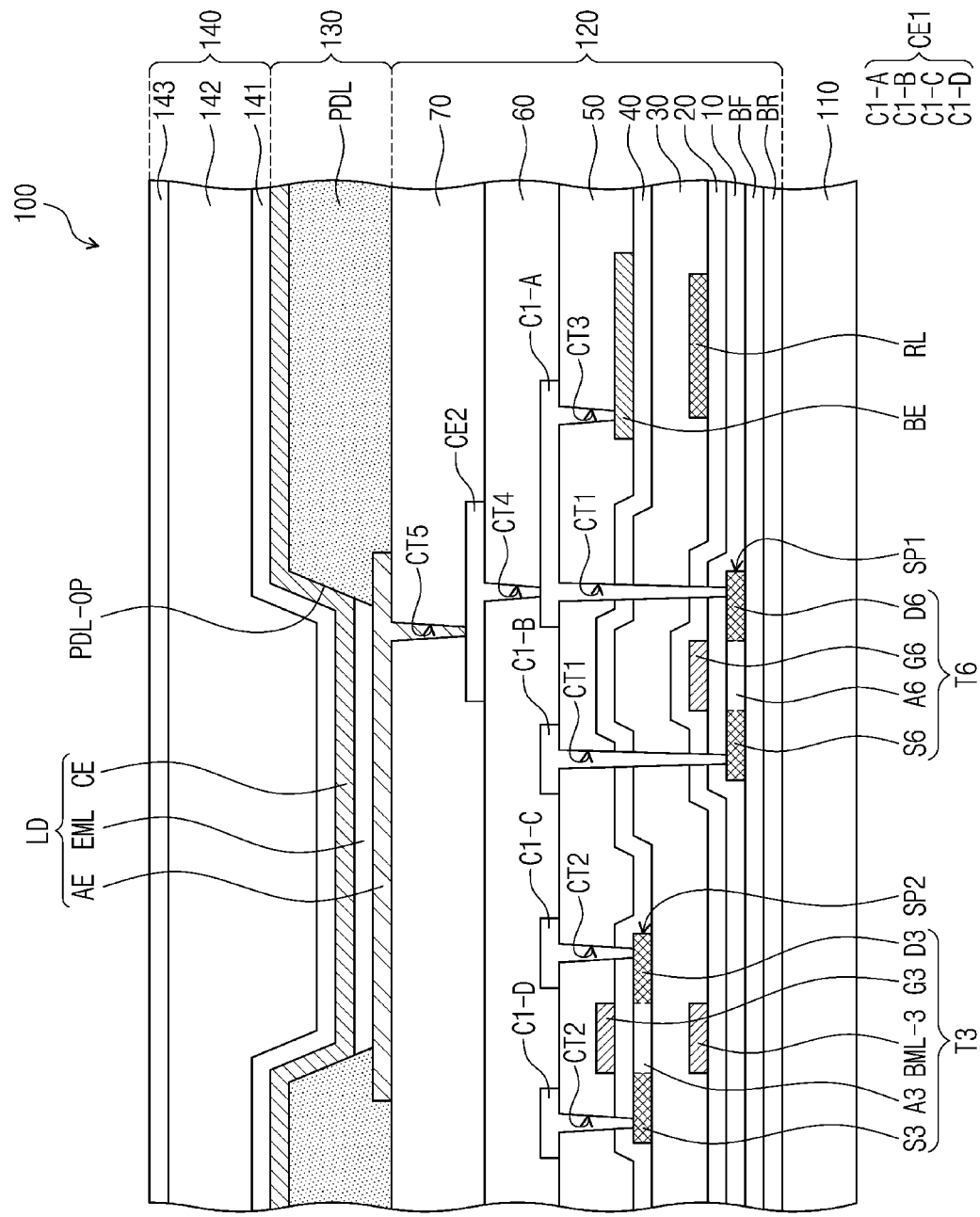
FIG. 4 is a cross-sectional view of a display panel according to an embodiment of the present disclosure.

FIG. 4 is a cross-sectional view of the display panel 100 according to an embodiment of the present disclosure.

Referring to FIG. 4, the display panel 100 may include the light emitting element LD and the pixel circuit PC (refer to FIG. 3B). In the present embodiment, two transistors, lower connection electrodes CE1, an upper connection electrode CE2, a bridge electrode BE, a repair line RL of the pixel circuit PC are shown as a representative example.

In the equivalent circuit shown in FIG. 3B, the third and fourth transistors T3 and T4 may be an oxide transistor, and the first, second, fifth, sixth, seventh, and eighth transistors T1, T2, T5, T6, T7, and T8 may be a silicon transistor. FIG. 4 shows the sixth transistor T6 among the silicon transistors and the third transistor T3 among the oxide transistors.

The base layer 110 may provide a base surface on which the circuit layer 120 is disposed.

The circuit layer 120 may be disposed on the base layer 110. According to an embodiment, the circuit layer 120 may include a barrier layer BR, a buffer layer BF, the sixth transistor T6, the third transistor T3, the lower connection electrodes CE1, the upper connection electrode CE2, first, second, third, fourth, and fifth insulating layers 10, 20, 30, 40, and 50, and first and second organic insulating layers 60 and 70.

The sixth transistor T6 may include a silicon semiconductor pattern SP1 and the first gate G6. FIG. 4 shows the sixth transistor T6 as a representative example of the silicon transistor, and a structure and a function of the sixth transistor T6 may be applied to other silicon transistors.

The third transistor T3 may include the light shielding pattern BML-3, an oxide semiconductor pattern SP2, and the second gate G3. FIG. 4 shows the third transistor T3 as a representative example of the oxide transistor, and a structure and a function of the third transistor T3 may be applied to the other oxide transistor. Hereinafter, a stack structure of components included in the circuit layer 120 will be described.

The barrier layer BR may be disposed on the base layer 110. The barrier layer BR may prevent a foreign substance from entering the base layer 110 from the outside. The barrier layer BR may include at least one inorganic layer. The barrier layer BR may include a silicon oxide layer and/or a silicon nitride layer. Each of the silicon oxide layer and the silicon nitride layer may be provided in plural, and the silicon oxide layers and the silicon nitride layers may be alternately stacked with each other.

The buffer layer BF may be disposed on the barrier layer BR. The buffer layer BF may prevent metal atoms or impurities from being diffused to the silicon semiconductor pattern SP1 disposed thereon from the base layer 110. The buffer layer BF may include at least one inorganic layer. The buffer layer BF may include a silicon oxide layer and/or a silicon nitride layer.

The silicon semiconductor pattern SP1 may be disposed on the buffer layer BF. The silicon semiconductor pattern SP1 may include a silicon semiconductor. As an example, the silicon semiconductor may include amorphous silicon or polycrystalline silicon. In more detail, the silicon semiconductor pattern SP1 may include low temperature polycrystalline silicon.

FIG. 4 shows just a portion of the silicon semiconductor pattern SP1, and the rest of the silicon semiconductor pattern SP1 may be disposed in another area. The silicon semiconductor pattern SP1 may have different electrical properties depending on whether it is doped or not or doped with an N-type dopant or a P-type dopant. The silicon semiconductor pattern SP1 may include a first portion having a relatively high conductivity and a second portion having a relatively low conductivity. The first portion may be doped with the N-type dopant or the P-type dopant. The P-type transistor may include a doped region doped with the P-type dopant, and the N-type transistor may include a doped region doped with the N-type dopant. The second portion may be a non-doped region or a region doped at a concentration lower than that of the first portion.

The first portion may have a conductivity greater than a conductivity of the second portion and may substantially serve as an electrode or a signal line. The second portion may substantially correspond to a channel area (or an active area) of the transistor. That is, a portion of the silicon semiconductor pattern SP1 may be the channel of the transistor, another portion of the silicon semiconductor pattern SP1 may be a source or a drain of the transistor, and the other portion of the silicon semiconductor pattern SP1 may be a connection electrode or a connection signal line.

The first input area S6, a first channel area A6 (or an active area), and the first output area D6 of the sixth transistor T6 may be formed from the silicon semiconductor pattern SP1. The first input area S6 and the first output area D6 may extend in opposite directions to each other from the first channel area A6 in a cross-sectional view.

The first insulating layer 10 may be disposed on the buffer layer BF. The first insulating layer 10 may cover the silicon semiconductor pattern SP1. The first insulating layer 10 may be an inorganic layer. The first insulating layer 10 may include at least one of aluminum oxide, titanium oxide, silicon oxide, silicon nitride, silicon oxynitride, zirconium oxide, and hafnium oxide. The first insulating layer 10 may have a single-layer structure of a silicon oxide layer; however, it should not be limited thereto or thereby. The first insulating layer 10 and each of the second to fifth insulating layers 20 to 50 described below may have a single-layer or multi-layer structure and may include at least one of the above-mentioned materials, however, it should not be limited thereto or thereby.

The first gate G6 of the sixth transistor T6 may be disposed on the first insulating layer 10. The first gate G6 may be a portion of a metal pattern. The first gate G6 may overlap the first channel area A6. The first gate G6 may be used as a mask in a process of doping the silicon semiconductor pattern SP1. The first gate G6 may include molybdenum (Mo), an alloy including molybdenum (Mo), titanium (Ti), an alloy including titanium (Ti), or the like, which has a good heat resistance, however, it should not be limited thereto or thereby.

The second insulating layer 20 may be disposed on the first insulating layer 10 and may cover the first gate G6.

The light shielding pattern BML-3 may be disposed on the second insulating layer 20. The light shielding pattern BML-3 may be disposed under the oxide semiconductor pattern SP2 and may overlap the oxide semiconductor pattern SP2. According to an embodiment, the light shielding pattern BML-3 may be omitted. According to an embodiment, the light shielding pattern BML-3 may extend to a lower portion of the sixth transistor T6.

According to the present embodiment, the repair line RL may be disposed on the second insulating layer 20. The repair line RL may be disposed on the same layer as the light shielding pattern BML-3 of the third transistor T3. That is, the repair line RL may be disposed on the same layer as the light shielding pattern of the oxide transistor.

The third insulating layer 30 may be disposed on the second insulating layer 20. The oxide semiconductor pattern SP2 may be disposed on the second insulating layer 20. The oxide semiconductor pattern SP2 may include a second channel area A3 of the third transistor T3. The oxide semiconductor pattern SP2 may include an oxide semiconductor. The oxide semiconductor pattern SP2 may include a transparent conductive oxide (TCO), such as indium tin oxide (ITO), indium zinc oxide (IZO), indium gallium zinc oxide (IGZO), zinc oxide ($ZnO_x$), or indium oxide ($In_2O_3$). The zinc oxide ($ZnO_x$) may be zinc oxide (ZnO) and/or zinc peroxide ($ZnO_2$).

The oxide semiconductor may include a plurality of areas distinguished from each other depending on whether a transparent conductive oxide is reduced. The area (hereinafter, referred to as a reduced area) in which the transparent conductive oxide is reduced has a conductivity greater than that of the area (hereinafter, referred to as a non-reduced area) in which the transparent conductive oxide is not reduced. The reduced area may substantially act as the source/drain of the transistor or the signal line. The non-reduced area may substantially correspond to the semiconductor area (or the channel) of the transistor. In other words, a portion of the oxide semiconductor pattern SP2 may be the semiconductor area of the transistor, another portion of the oxide semiconductor pattern SP2 may be the source area/drain area of the transistor, and the other portion of the oxide semiconductor pattern SP2 may be a signal transmission area.

The fourth insulating layer 40 may be disposed on the third insulating layer 30. The fourth insulating layer 40 may cover the oxide semiconductor pattern SP2. The second gate G3 of the third transistor T3 may be disposed on the fourth insulating layer 40. The second gate G3 may overlap the light shielding pattern BML-3.

According to an embodiment, the third transistor T3 may include two gates, and the two gates may be the light shielding pattern BML-3 disposed on the second insulating layer 20 and the second gate G3 disposed on the fourth insulating layer 40, respectively. In this case, the light shielding pattern BML-3 may include a metal layer. The light shielding pattern BML-3 may be electrically connected to the second gate G3 via a contact hole (not shown) defined through the third insulating layer 30 and the fourth insulating layer 40.

The second gate G3 of the third transistor T3 may be a portion of a metal pattern. The second gate G3 of the third transistor T3 may overlap the second channel area A3. The second gate G3 may include molybdenum (Mo), an alloy including molybdenum (Mo), titanium (Ti), or an alloy including titanium (Ti), which has a good heat resistance. The second gate G3 may include a titanium layer and a molybdenum layer disposed on the titanium layer.

According to the present embodiment, the bridge electrode BE may be disposed on the fourth insulating layer 40. The bridge electrode BE may be disposed on the same layer as the second gate G3 of the third transistor T3. That is, the bridge electrode BE may be disposed on the same layer as the second gate of the oxide transistor.

The bridge electrode BE may be disposed to overlap at least a portion of the repair line RL. The bridge electrode BE may be insulated from the repair line RL by the third and fourth insulating layers 30 and 40 before the repair process is performed. After the repair process is performed, the bridge electrode BE may be connected to the repair line RL. This will be described in detail below.

The fifth insulating layer 50 may be disposed on the fourth insulating layer 40, and the fifth insulating layer 50 may cover the second gate G3. Each of the first to fifth insulating layers 10 to 50 may be an inorganic layer.

The lower connection electrodes CE1 may be disposed on the fifth insulating layer 50. The lower connection electrodes CE1 may include first lower connection electrodes C1-A and C1-B and second lower connection electrodes C1-C and C1-D. The first lower connection electrodes C1-A and C1-B may be connected to the first input area S6 and the first output area D6 of the silicon semiconductor pattern SP1, respectively. The first lower connection electrodes C1-A and C1-B may be respectively connected to the first input area S6 and the first output area D6 of the silicon semiconductor pattern SP1 via first contact holes CT1 defined in the first to fifth insulating layers 10 to 50.

In the present disclosure, the expression "one component is connected to another component disposed on another layer" means that one component makes direct contact with and is connected to another component via a contact hole defined in an insulating layer disposed between one component and another component. On the other hand, the expression "one component is electrically connected to another component disposed on another layer" means that one component and another component do not make direct contact with each other but are connected to each other by at least one third component.

The second lower connection electrodes C1-C and C1-D may be connected to the second input area D3 and the second output area S3 of the oxide semiconductor pattern SP2, respectively. The second lower connection electrodes C1-C and C1-D may be respectively connected to the second input area D3 and the second output area S3 of the oxide semiconductor pattern SP2 via second contact holes CT2 defined in the fourth and fifth insulating layers 40 and 50.

According to the present embodiment, between the first lower connection electrode C1-A and the first lower connection electrode C1-B, the first lower connection electrode C1-A connected to the first output area D6 of the silicon semiconductor pattern SP1 may be connected to the bridge electrode BE. The first lower connection electrode C1-A may be connected to the bridge electrode BE via a third contact hole CT3 defined in the fifth insulating layer 50.

The organic insulating layers 60 and 70 may be disposed on the fifth insulating layer 50. The first organic insulating layer 60 may be disposed on the fifth insulating layer 50, and the second organic insulating layer 70 may be disposed on the first organic insulating layer 60.

The first organic insulating layer 60 may compensate for a step difference on the fifth insulating layer 50 disposed under the first organic insulating layer 60 and may provide a flat upper surface. As an example, each of the first and second organic insulating layers 60 and 70 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The upper connection electrode CE2 may be disposed on the first organic insulating layer 60. The upper connection electrode CE2 may be connected to the first lower connection electrode C1-A connected to the first output area D6 of the sixth transistor T6 and the bridge electrode BE between the first lower connection electrodes C1-A and C1-B via a fourth contact hole CT4 defined in the first organic insulating layer 60.

The light emitting element layer 130 may be disposed on the circuit layer 120. The light emitting element layer 130 may include the light emitting element LD and a pixel definition layer PDL, and the light emitting element LD may include the anode AE, a light emitting layer EML, and a cathode electrode CE (or a common electrode). The anode AE may be commonly provided to the plural light emitting elements.

The anode AE of the light emitting element LD may be disposed on the second organic insulating layer 70. The anode AE may be a transmissive electrode, a semi-transmissive electrode, or a reflective electrode. According to an embodiment, the anode AE may include a reflective layer formed of silver (Ag), magnesium (Mg), aluminum (Al), platinum (Pt), lead (Pd), gold (Au), nickel (Ni), Neodymium (Nd), Iridium (Ir), chromium (Cr), or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide ($In_2O_3$), and aluminum-doped zinc oxide (AZO). For instance, the anode AE may have a stack structure of ITO/Ag/ITO, however, it should not be limited thereto or thereby.

The anode AE may be connected to the upper connection electrode CE2. In detail, the anode AE may be connected to the upper connection electrode CE2 via a fifth contact hole CT5 defined in the second organic insulating layer 70. Accordingly, each of the silicon transistor and the bridge electrode BE included in the pixel circuit PC may be electrically connected to the anode AE, i.e., the light emitting element LD.

The pixel definition layer PDL may be disposed on the second organic insulating layer 70. The pixel definition layer PDL may have a transparent property or a light absorbing property. As an example, the pixel definition layer PDL absorbing the light may include a black coloring agent. The black coloring agent may include a black dye or a black pigment. The black coloring agent may include a metal material, such as carbon black, chromium, or an oxide thereof. The pixel definition layer PDL may correspond to a light shielding pattern having a light shielding property.

The pixel definition layer PDL may be provided with an opening PDL-OP defined therein to expose a portion of the anode AE. The pixel definition layer PDL may cover a portion of the anode AE. The pixel definition layer PDL may increase a distance between an edge of the anode AE and the cathode CE. Accordingly, the occurrence of an arc in the edge of the anode AE may be prevented by the pixel definition layer PDL.

Although not shown in figures, a hole transport layer may be disposed between the anode AE and the light emitting layer EML. In addition, a hole injection layer may be disposed between the anode AE and the hole transport layer. An electron transport layer may be disposed between the light emitting layer EML and the cathode CE. An electron injection layer may be disposed between the electron transport layer and the cathode CE. Each of the hole transport layer, the hole injection layer, the electron transport layer, and the electron injection layer may be commonly formed in the pixels arranged in one row among the pixels PX (refer to FIG. 2).

The encapsulation layer 140 may be disposed on the light emitting element layer 130. The encapsulation layer 140 may include an inorganic encapsulation layer 141, an organic encapsulation layer 142, and an inorganic encapsulation layer 143, which are sequentially stacked, however, layers forming the encapsulation layer 140 should not be limited thereto or thereby.

The inorganic encapsulation layers 141 and 143 may protect the light emitting element layer 130 from moisture and oxygen, and the organic encapsulation layer 142 may protect the light emitting element layer 130 from a foreign substance such as dust particles. The inorganic encapsulation layers 141 and 143 may include a silicon nitride layer, a silicon oxynitride layer, a silicon oxide layer, a titanium oxide layer, or an aluminum oxide layer. The organic encapsulation layer 142 may include an acrylic-based organic layer, however, it should not be limited thereto or thereby.

Figure 5:
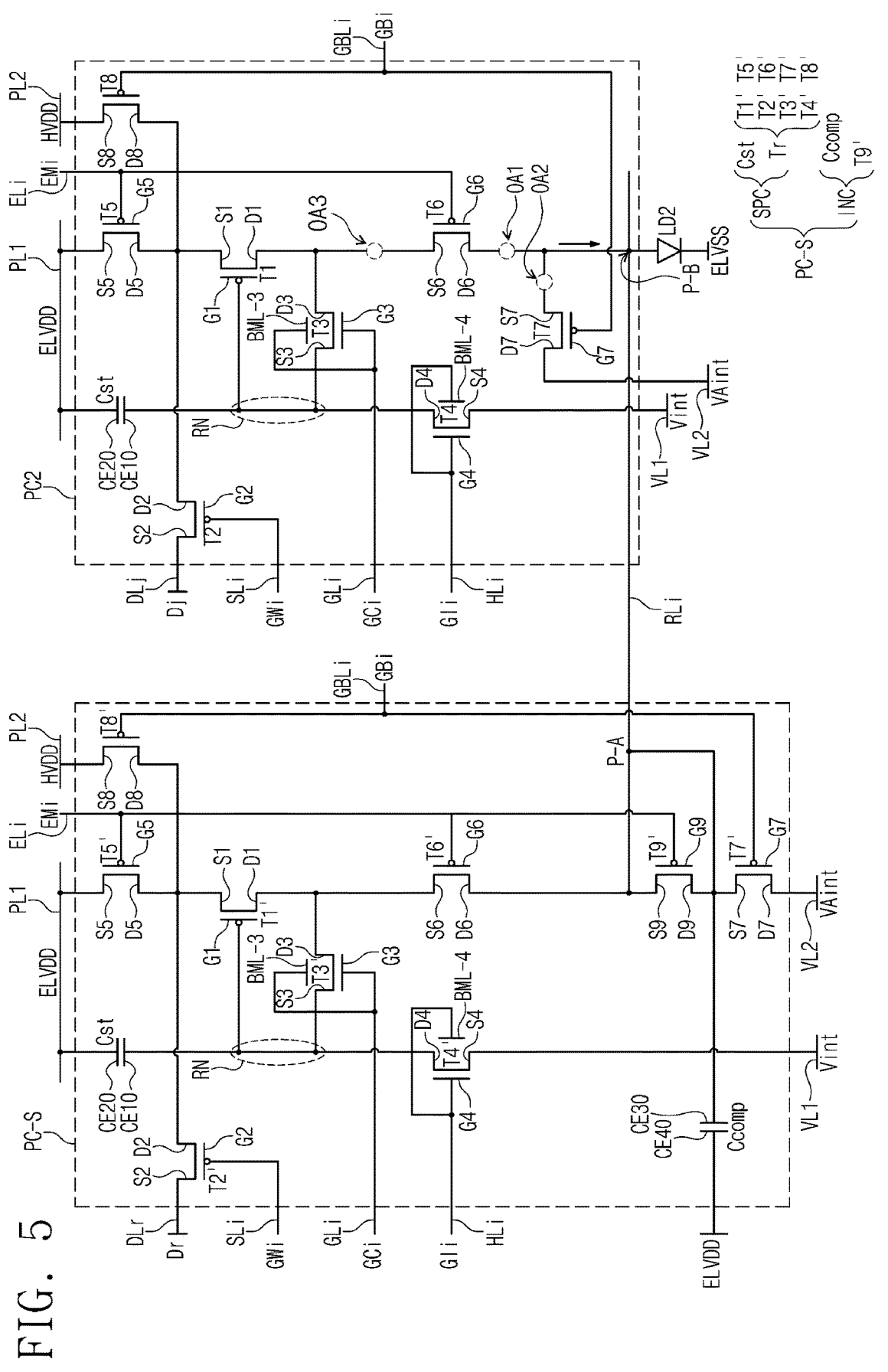
Figure 6A:
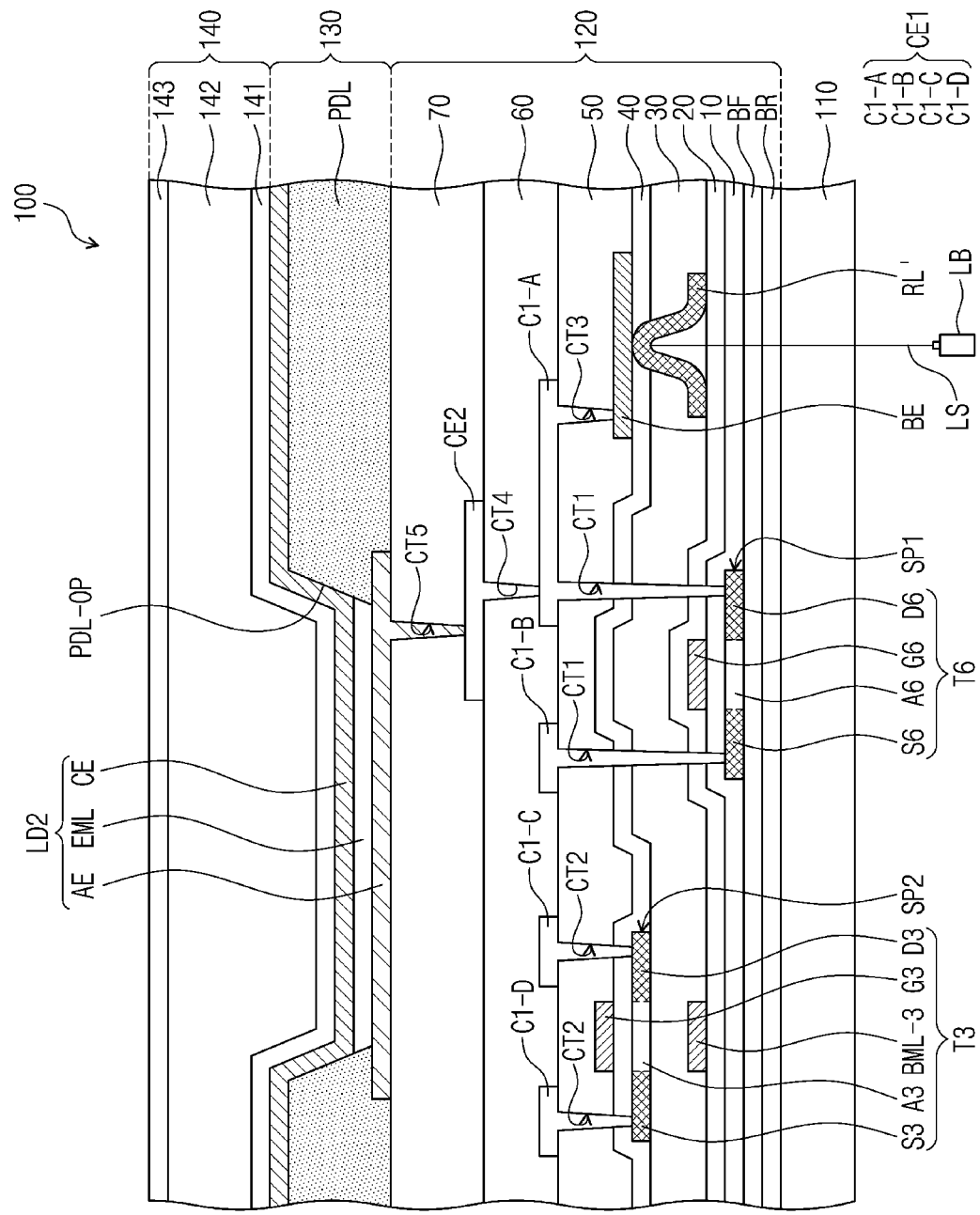
FIG. 6A is a cross-sectional view of a portion of a display panel according to an embodiment of the present disclosure.
Figure 6B:
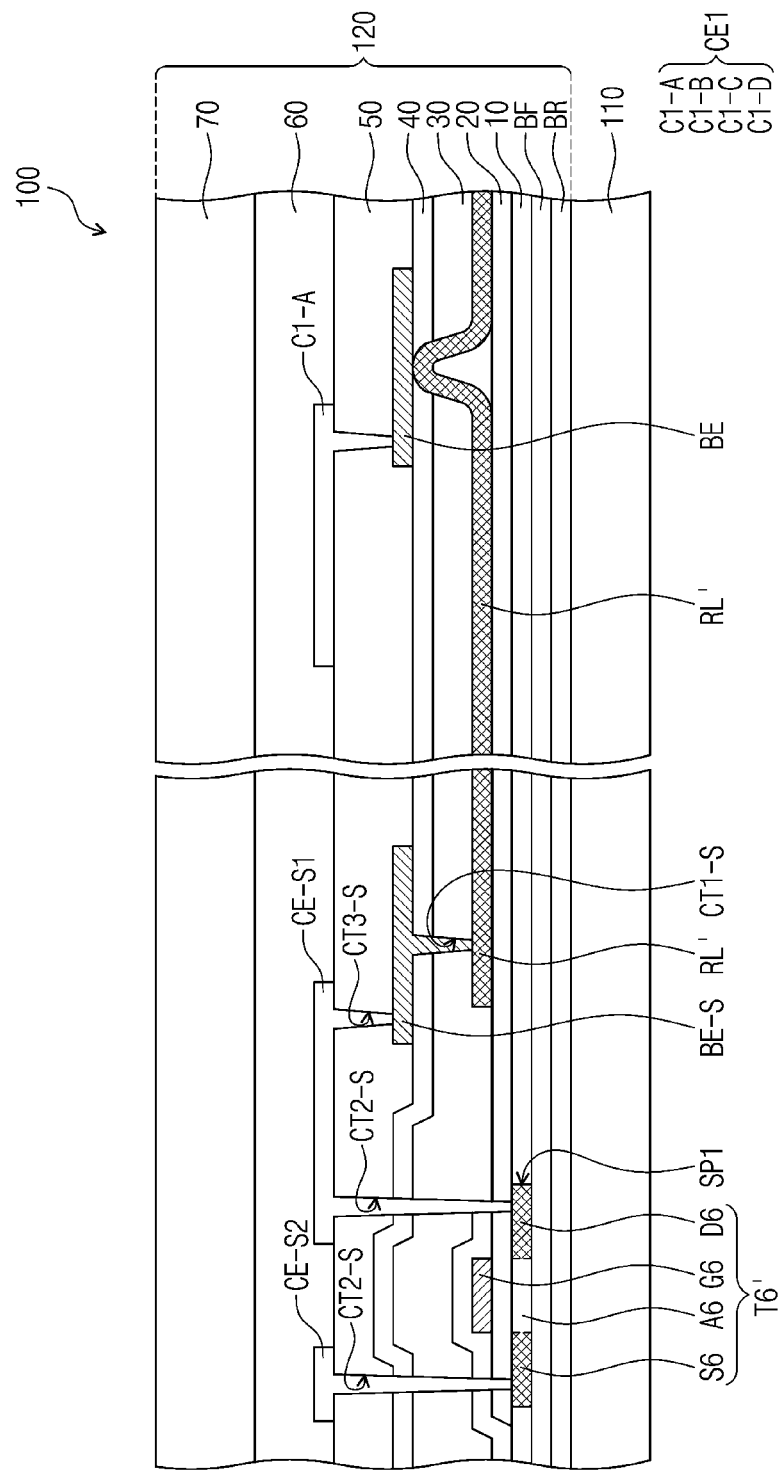
FIG. 6B is a cross-sectional view of a portion of a display panel according to an embodiment of the present disclosure.
Figure 7:
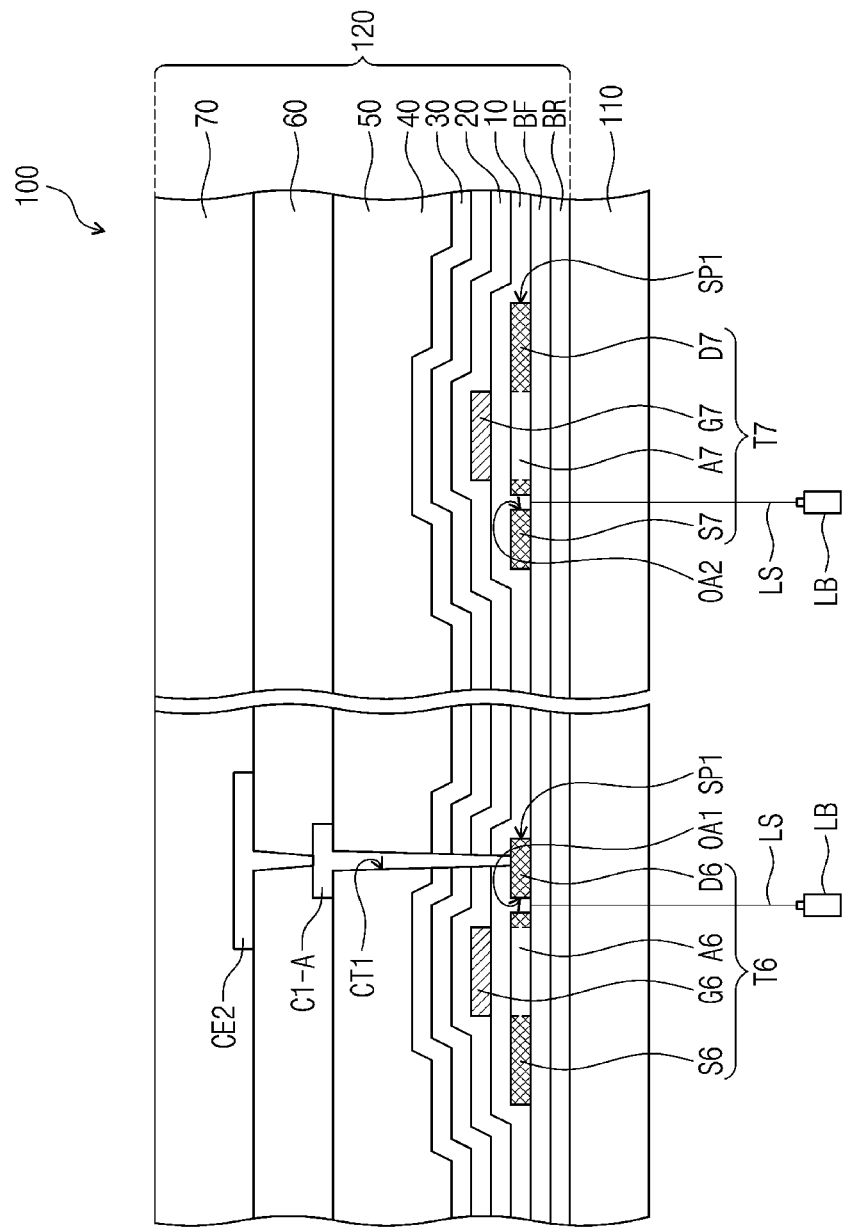
FIG. 7 is a cross-sectional view of a portion of a display panel according to an embodiment of the present disclosure.

FIG. 5 is an equivalent circuit diagram of the pixel and the repair circuit PC-S according to an embodiment of the present disclosure. FIG. 6A is a cross-sectional view of a portion of the display panel 100 according to an embodiment of the present disclosure. FIG. 6B is a cross-sectional view of a portion of the display panel 100 according to an embodiment of the present disclosure. FIG. 7 is a cross-sectional view of a portion of the display panel 100 according to an embodiment of the present disclosure.

Referring to FIG. 5, the display panel 100 (refer to FIG. 1) may include the pixels PX (refer to FIG. 3A), the repair circuits PC-S, and the repair lines RL1 to RLn (refer to FIG. 3A). FIG. 5 shows the second pixel PX2 (refer to FIG. 3A) among the pixels PX (refer to FIG. 3A), a repair circuit disposed at the same row as the second pixel PX2 among the repair circuits PC-S, and a repair line RLi connected to the repair circuit among the repair lines RL1 to RLn (refer to FIG. 3A). In addition, FIG. 5 shows the equivalent circuit diagram of the second pixel PX2 and the repair circuit PC-S after the repair process.

According to the present embodiment, the second pixel PX2 may include a defective second pixel circuit PC2 and the second light emitting element LD2 to which a driving current is not supplied due to the defective second pixel circuit PC2. The second pixel circuit PC2 may be a circuit that becomes defective during the process of the pixel circuit PC (refer to FIG. 3B) or during the use of the display panel 100 (refer to FIG. 1).

According to an embodiment, the repair circuit PC-S may include a sub-pixel circuit SPC and an initialization circuit INC.

The sub-pixel circuit SPC may have a circuit equivalent to the pixel circuit PC described with reference to FIG. 4. That is, the sub-pixel circuit SPC may have a circuit equivalent to the pixel circuit to which the disconnection area of the second pixel circuit is connected. The sub-pixel circuit SPC may include a sub-storage capacitor Cst' and a repair transistor Tr, and the repair transistor Tr may include first, second, third, fourth, fifth, sixth, seventh, and eighth sub-transistors T1', T2', T3', T4', T5', T6', T7', and T8'.

The sub-storage capacitor Cst' of the sub-pixel circuit SPC may correspond to the storage capacitor Cst of the pixel circuit PC. The first to eighth sub-transistors T1' to T8' of the sub-pixel circuit SPC may correspond to the first to eighth transistors T1 to T8 (refer to FIG. 3B) of the pixel circuit PC.

That is, the sub-storage capacitor Cst' and the sub-transistors T1' to T8', which form the sub-pixel circuit SPC, are connected in the same manner as the capacitor and the transistors of the second pixel circuit PC2, and thus, details thereof are the same as those described with reference to FIG. 3B. In addition, the first to eighth sub-transistors T1' to T8' have the same stack structure as those of the first to eighth transistors T1 to T8, respectively, and accordingly details thereof are the same as those described in FIG. 4.

However, a sub-data line DLr may be connected to a first input area S2 of the second sub-transistor T2' of the sub-pixel circuit SPC. The sub-data line DLr may obtain coordinate information of the second pixel PX2 subjected to the repair process and may transmit a data signal Dr with respect to corresponding coordinates. The initialization circuit INC may include a holding capacitor Ccomp and a ninth sub-transistor T9'. The holding capacitor Ccomp may be electrically connected to between the first voltage line PL1 receiving the first power supply voltage ELVDD and a node between a first input area S7 of the seventh sub-transistor T7' and a first output area D9 of the ninth sub-transistor T9'. The holding capacitor Ccomp may include a third electrode CE30 electrically connected to the node between the first input area S7 of the seventh sub-transistor T7' and the first output area D9 of the ninth sub-transistor T9' and a fourth electrode CE40 electrically connected to the first voltage line PL1.

The ninth sub-transistor T9' may be electrically connected between the first input area S7 of the seventh sub-transistor T7' and a first output area D6 of the sixth sub-transistor T6'. The first output area D9 of the ninth sub-transistor T9' may be electrically connected to the first input area S7 of the seventh sub-transistor T7'. A first input area S9 of the ninth sub-transistor T9' may be electrically connected to the first output area D6 of the sixth sub-transistor T6'. A first gate G9 of the ninth sub-transistor T9' may be electrically connected to the i-th light emitting line ELi.

The repair line RLi may be connected between the first output area D6 of the sixth sub-transistor T6' and the first input area S9 of the ninth sub-transistor T9'. Accordingly, the repair line RLi may be electrically connected to the repair circuit PC-S regardless of whether or not the repair process is performed.

In addition, the repair line RLi may be connected to the node between the first output area D9 of the ninth sub-transistor T9' and the first input area S7 of the seventh sub-transistor T7', i.e., the node connected to the third electrode CE30 of the holding capacitor Ccomp.

According to an embodiment, a first connection portion P-A may be short circuited in the repair process such that the repair line RLi may be connected to a line extending from the node between the first output area D9 of the ninth sub-transistor T9' and the first input area S7 of the seventh sub-transistor T7', i.e., the node connected to the third electrode CE30 of the holding capacitor Ccomp.

According to the present embodiment, after the repair process, the repair line RLi may be electrically connected to the second light emitting element LD2 of the second pixel PX2. According to an embodiment, a second connection portion P-B may be short circuited in the repair process such that the repair line RLi may be electrically connected to the second light emitting element LD2. This will be described in detail below.

In addition, after the repair process, the sixth transistor T6 may be electrically insulated from the second light emitting element LD2 in the second pixel circuit PC2, and the seventh transistor T7 may be electrically insulated from the second light emitting element LD2 in the second pixel circuit PC2.

According to an embodiment, some of the silicon transistors may include disconnection areas OA1, OA2, and OA3. The disconnection areas OA1, OA2, and OA3 may include a first disconnection area OA1, a second disconnection area OA2, and a third disconnection area OA3.

The first disconnection area OA1 may be included in the first output area D6 of the sixth transistor T6. That is, the first disconnection area OA1 may be included in the first output area D6 of the silicon transistor supplying the driving current to the second light emitting element LD2 among the silicon transistors.

The second disconnection area OA2 may be included in the first input area S7 of the seventh transistor T7. That is, the second disconnection area OA2 may be included in the first input area S7 of the silicon transistor supplying the second initialization voltage VAint to the anode of the second light emitting element LD2 among the silicon transistors.

The third disconnection area OA3 may be included in the first input area S6 of the sixth transistor T6. That is, the third disconnection area OA3 may be included in the first input area S6 of the silicon transistor supplying the driving current to the second light emitting element LD2 among the silicon transistors.

Accordingly, the sixth transistor T6 may be electrically insulated from the second light emitting element LD2, and the seventh transistor T7 may be electrically insulated from the second light emitting element LD2.

As the sixth transistor T6 includes the disconnection areas OA1 and OA3 respectively defined at the first output area D6 and the first input area S6, the sixth transistor T6 may be completely disconnected from the second light emitting element LD2, and even a small amount of driving current may be prevented from passing through therebetween. However, according to an embodiment, the third disconnection area OA3 may be omitted.

According to the present disclosure, before the repair process, since the driving current is not supplied to the second light emitting element LD2 due to the second pixel circuit PC2 being defective, the second pixel PX2 may not emit light. However, when the electrical connection between the defective second pixel circuit PC2 and the second light emitting element LD2 is blocked and the repair line RLi is electrically connected to the second light emitting element LD2 of the second pixel PX2 via the repair process, the second light emitting element LD2 of the second pixel PX2 on which the repair process is performed may receive the driving current via the repair line RLi and may operate as a normal element.

FIG. 6A shows an enlarged cross-sectional view of a portion of the display panel 100 after the repair process. In detail, FIG. 6A shows a connection relationship between a repair line RL' on which the repair process is performed and the second light emitting element LD2, i.e., a connection relationship of the second connection portion P-B. Referring to FIG. 6A, the repair line RL' may be connected to the bridge electrode BE after the repair process. In this case, the connection relations between the repair line RL' and the bridge electrode BE may be applied to the first connection portion P-A, and hereinafter, the second connection portion P-B will be mainly described with reference to FIG. 6A.

According to an embodiment, the repair process may be performed by irradiating a laser LS to a direction to the repair line RL (refer to FIG. 4) from under a lower surface of the base layer 110. A portion of the repair line RL to which the laser LS is irradiated may be melted, and the partially-melted repair line RL may melt portions of the third and fourth insulating layers 30 and 40 adjacent thereto. The melted repair line RL may be connected to the bridge electrode BE after passing through the melted portions of the third and fourth insulating layers 30 and 40.

Accordingly, the repair line RL' may be connected to the bridge electrode BE, may be electrically connected to the first lower connection electrode C1-A by the bridge electrode BE, and may be electrically connected to the upper connection electrode CE2 and the anode AE of the second light emitting element LD2 by the first lower connection electrode C1-A.

Different from the present embodiment, in a case where the bridge electrode BE is absent, the repair line RL' may be required to be directly connected to the first lower connection electrode C1-A. In this case, only when all the third to fifth insulating layers 30 to 50 are sufficiently melted, the repair line RL' may be connected to the first lower connection electrode C1-A through the third to fifth insulating layers 30 to 50.

However, since the third to fifth insulating layers 30 to 50 have a relatively large thickness, the third to fifth insulating layers 30 to 50 may not melt sufficiently. That is, the repair line RL' may not pass through all the third to fifth insulating layers 30 to 50 and thus may not be connected to the first lower connection electrode C1-A. Accordingly, a yield of the repair process for the defective pixel may be low.

According to the present embodiment, as the bridge electrode BE connected to the first lower connection electrode C1-A is further disposed on the same layer as the second gate G3, the repair line RL' may be more easily connected to the bridge electrode BE through the third and fourth insulating layers 30 and 40 that are sufficiently melted. That is, as the thickness of the insulating layers through which the repair line RL' is required to pass decreases, the yield of the repair process for the defective pixel may be enhanced. Accordingly, reliability of the display panel 100 may be improved.

FIG. 6B shows a cross-section of the display panel 100 taken along a direction in which the repair line RL' extends. Referring to FIG. 6B, the repair line RL' may be electrically connected to the first output area D6 of the sixth sub-transistor T6' included in the repair circuit PC-S.

According to an embodiment, the repair circuit PC-S may include a sub-bridge electrode BE-S disposed on the fourth insulating layer 40. The sub-bridge electrode BE-S may be connected to the repair line RL' via a first sub-contact hole CT1-S defined in the third and fourth insulating layers 30 and 40.

The repair circuit PC-S may include sub-connection electrodes CE-S1 and CE-S2 disposed on the fifth insulating layer 50. The sub-connection electrodes CE-S1 and CE-S2 may be respectively connected to the first output area D6 and the first input area S6 of the sixth sub-transistor T6' via second sub-contact holes CT2-S defined in the first to fifth insulating layers 10 to 50.

Between the sub-connection electrodes CE-S1 and CE-S2, the sub-connection electrode CE-S1 connected to the first output area D6 of the sixth sub-transistor T6' may be connected to the repair line RL' via a third sub-contact hole CT3-S defined in the fifth insulating layer 50.

As the sub-connection electrode CE-S1 is connected to the sub-bridge electrode BE-S and the first output area D6 of the sixth sub-transistor T6', the repair line RL' may be electrically connected to the sixth sub-transistor T6' of the repair circuit PC-S.

However, the structure wherein the repair line RL' is connected to the repair circuit PC-S is not a limitation of the inventive concept. According to an embodiment, the repair line RL' may be directly connected to the sub-connection electrode CE-S1 that is connected to the first output area D6 of the sixth sub-transistor T6' via a contact hole defined in the third to fifth insulating layers 30 to 50 and the first organic insulating layer 60.

FIG. 7 shows a cross-section of the first and second disconnection areas OA1 and OA2 among the first, second, and third disconnection areas OA1, OA2, and OA3 described with reference to FIG. 5. The first disconnection area OA1 may be included in the first output area D6 of the sixth transistor T6 in the second pixel circuit PC2 (refer to FIG. 5). The second disconnection area OA2 may be included in the first input area S7 of the seventh transistor T7 in the second pixel circuit PC2 (refer to FIG. 5).

According to an embodiment, a portion of the first output area D6 of the sixth transistor T6 and a portion of the first input area S7 of the seventh transistor T7 may be cut by the laser LS in the repair process.

As the laser LS is irradiated to the first output area D6 of the sixth transistor T6 in a direction toward the lower surface of the base layer 110 from under the lower surface of the base layer 110, the portion of the first output area D6 of the sixth transistor T6 may be melted and cut. As the laser LS is irradiated to the first output area S7 of the seventh transistor T7 in the direction toward the lower surface of the base layer 110 from under the lower surface of the base layer 110, the portion of the first input area S7 of the seventh transistor T7 may be melted and cut.

FIG. 7 shows only the first and second disconnection areas OA1 and OA2. Although not explicitly depicted, the cut shape of the third disconnection area OA3 may also be similar to that of the first and second disconnection areas OA1 and OA2.

Figure 8:
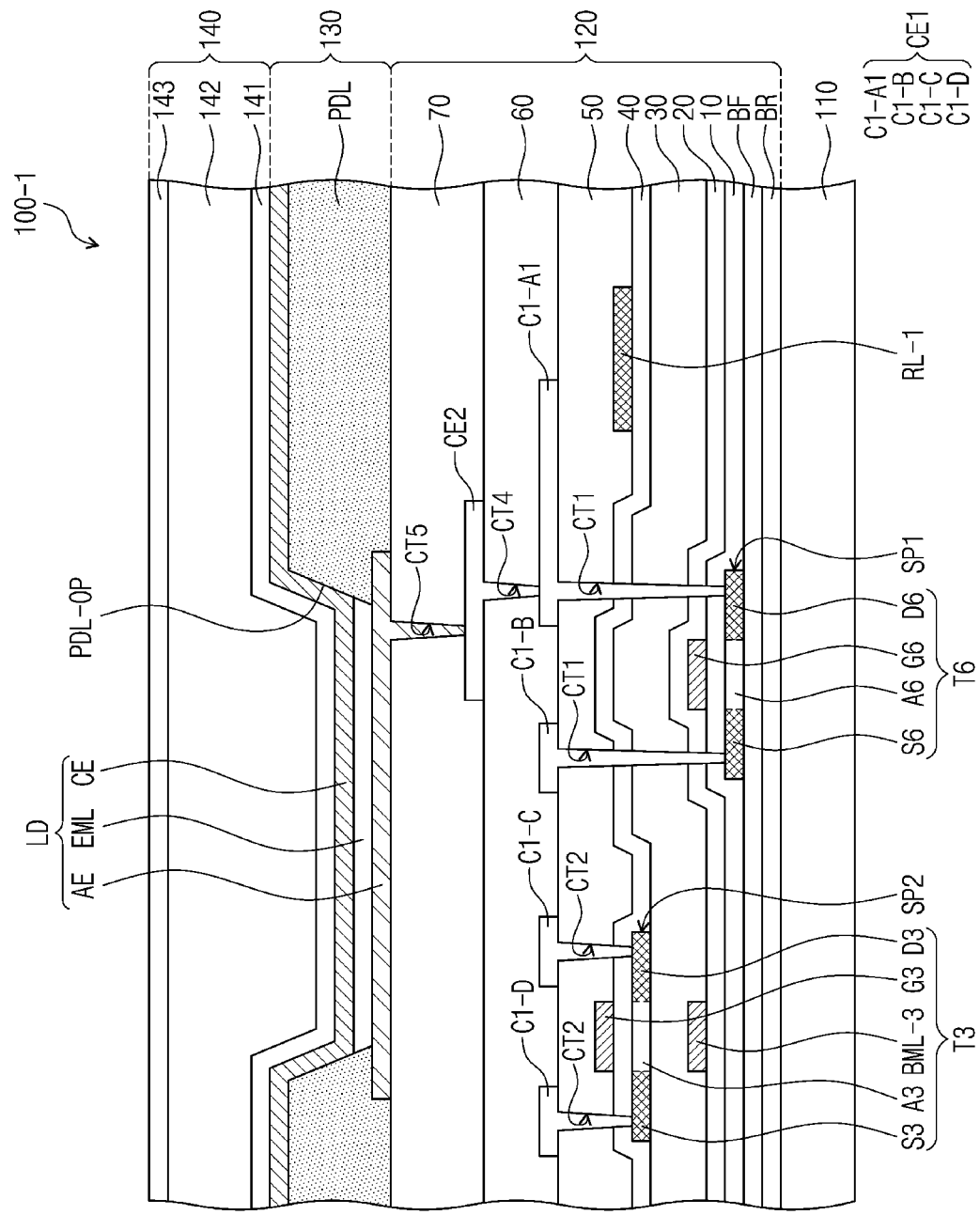
FIG. 8 is a cross-sectional view of a portion of a display panel according to an embodiment of the present disclosure.

FIG. 8 is a cross-sectional view of a display panel 100-1. In addition, FIG. 8 shows a cross-section of the display panel 100-1 on which the repair process is not performed. In FIG. 8, the same/similar reference numerals denote the same/similar elements in FIGS. 1A to 7, and thus, detailed descriptions of the same/similar elements will be omitted.

Referring to FIG. 8, the display panel 100-1 may include a light emitting element LD and a pixel circuit PC (refer to FIG. 4B), and the pixel circuit PC may include a silicon transistor, an oxide transistor, lower connection electrodes CE1, an upper connection electrode CE2, and a repair line RL-1. FIG. 8 shows a sixth transistor T6 among silicon transistors and a third transistor T3 among oxide transistors.

According to the present embodiment, the repair line RL-1 may be disposed on a fourth insulating layer 40 and may be covered by a fifth insulating layer 50. The repair line RL-1 may be disposed on the same layer as a second gate G3 of the third transistor T3. That is, the repair line RL-1 may be disposed on the same layer as the second gate G3 of the oxide transistor.

The repair process may be performed by irradiating a laser in a direction toward the repair line RL-1 from under a lower surface of the base layer 110. A portion of the repair line RL-1 to which the laser is irradiated may be melted, and a portion of the fifth insulating layer 50 adjacent to the repair line RL-1 may be melted by the melted portion of the repair line RL-1.

The melted repair line RL-1 may be connected to a first lower connection electrode C1-A1 after passing through the melted fifth insulating layer 50. As the first lower connection electrode C1-A1 is connected to the upper connection electrode CE2, the repair line RL-1 may be connected to an anode AE of a second light emitting element LD2.

According to the present embodiment, the repair line RL-1 may be directly connected to the first lower connection electrode C1-A1 without placing a separate bridge electrode BE (refer to FIG. 4) between the repair line RL-1 and the first lower connection electrode C1-A1. As the repair line RL-1 is disposed adjacent to the first lower connection electrode C1-A1, a thickness of insulating layers through which the repair line RL' passes decreases, and a yield of the repair process for the defective pixel may be enhanced. Accordingly, a reliability of the display panel 100-1 may be improved.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A display panel comprising:
   a base layer comprising a display area and a non-display area;
   a repair circuit disposed in the non-display area;
   a pixel disposed in the display area and comprising a pixel circuit and a light emitting element electrically connected to the pixel circuit; and
   a repair line electrically connected to the repair circuit and extending from the repair circuit to the pixel, the pixel circuit comprising:
     a silicon transistor comprising a silicon semiconductor pattern comprising a first input area, a first channel area, and a first output area and a first gate disposed on the silicon semiconductor pattern and overlapping the first channel area;
     an oxide transistor comprising a light shielding pattern disposed on the first gate and disposed on a same layer as a layer on which the repair line is disposed, an oxide semiconductor pattern disposed on the light shielding pattern and comprising a second input area, a second channel area, and a second output area, and a second gate disposed on the oxide semiconductor pattern and overlapping the second channel area; and
     a bridge electrode disposed on a same layer as a layer on which the second gate is disposed, overlapping the repair line, and electrically connected to the light emitting element and the silicon transistor,
   wherein the silicon semiconductor pattern of the silicon transistor and the oxide semiconductor pattern of the oxide transistor are disposed on different layers.

2. The display panel of claim 1, further comprising a first connection electrode disposed on the second gate, connected to the first output area of the silicon transistor and the bridge electrode, and electrically connected to the light emitting element.

3. The display panel of claim 2, further comprising a second connection electrode disposed on the first connection electrode and connected to the first connection electrode and the light emitting element.

4. The display panel of claim 2, further comprising first, second, third, fourth, and fifth insulating layers sequentially disposed on the base layer, wherein the silicon semiconductor pattern of the silicon transistor is disposed between the base layer and the first insulating layer, the first gate of the silicon transistor is disposed between the first and second insulating layers, each of the light shielding pattern and the repair line of the oxide transistor is disposed between the second and third insulating layers, the oxide semiconductor pattern of the oxide transistor is disposed between the third and fourth insulating layers, each of the second gate of the oxide transistor and the bridge electrode is disposed between the fourth and fifth insulating layers, and the first connection electrode is disposed on the fifth insulating layer and is connected to the bridge electrode via a contact hole in the fifth insulating layer.

5. The display panel of claim 1, wherein the light shielding pattern comprises a metal layer, and the light shielding pattern is electrically connected to the second gate.

6. The display panel of claim 1, wherein the repair circuit comprises a repair transistor having a same stack structure as a stack structure of the silicon transistor.

7. The display panel of claim 6, wherein the repair circuit further comprises a sub-bridge electrode disposed on a same layer as a layer on which the second gate is disposed and electrically connected to the repair line and the repair transistor.

8. The display panel of claim 1, wherein each of the pixel, the repair circuit, and the repair line is provided in plural, the pixels are arranged in a first direction and a second direction crossing the first direction, the repair circuits are arranged in one of the first and second directions, and each of the repair lines extends from a corresponding repair circuit among the repair circuits to the other one of the first and second directions.

9. A display panel comprising:
   a base layer comprising a display area and a non-display area;
   a first pixel disposed in the display area and comprising a first pixel circuit and a first light emitting element electrically connected to the first pixel circuit;
   a second pixel disposed in the display area and comprising a second pixel circuit comprising a disconnection area and a second light emitting element;
   a repair circuit disposed in the non-display area; and
   a repair line electrically connected to the repair circuit and extending from the repair circuit to the second pixel, the second pixel circuit comprising:
     a silicon transistor comprising a silicon semiconductor pattern comprising a first input area, a first channel area, and a first output area and a first gate disposed on the silicon semiconductor pattern and overlapping the first channel area;
     an oxide transistor comprising a light shielding pattern disposed on the first gate and disposed on a same layer as a layer on which the repair line is disposed, an oxide semiconductor pattern disposed on the light shielding pattern and comprising a second input area, a second channel area, and a second output area, and a second gate disposed on the oxide semiconductor pattern and overlapping the second channel area;
     a bridge electrode disposed on a same layer as a layer on which the second gate is disposed and electrically connected to the second light emitting element, wherein the repair line is connected to the bridge electrode to electrically connect the second light emitting element and the repair circuit,
wherein the silicon semiconductor pattern of the silicon transistor and the oxide semiconductor pattern of the oxide transistor are disposed on different layers.

10. The display panel of claim 9, wherein the first output area of the silicon transistor supplying a driving current to the second light emitting element comprises the disconnection area.

11. The display panel of claim 10, wherein the first input area of the silicon transistor supplying the driving current to the second light emitting element comprises the disconnection area.

12. The display panel of claim 9, wherein the first input area of the silicon transistor supplying an initialization voltage to an anode of the second light emitting element comprises the disconnection area.

13. The display panel of claim 9, wherein the second pixel circuit further comprises a storage capacitor connected between a first voltage line receiving a first power supply voltage and a reference node, the silicon transistor comprises a first transistor connected between the first voltage line and the second light emitting element, a second transistor connected between a data line and a first input area of the first transistor, a fifth transistor connected between the first voltage line and the first input area of the first transistor, a sixth transistor connected between the second light emitting element and a first output area of the first transistor, a seventh transistor connected between a third voltage line receiving a second initialization voltage and the second light emitting element, and an eighth transistor connected between a fourth voltage line receiving a third initialization voltage and the first input area of the first transistor, the oxide transistor comprises a third transistor connected between the reference node and the first output area of the first transistor and a fourth transistor connected between the reference node and a second voltage line receiving a first initialization voltage, and the disconnection area is defined between the sixth transistor and the second light emitting element and between the seventh transistor and the second light emitting element.

14. The display panel of claim 9, wherein the repair circuit comprises a sub-pixel circuit having a circuit equivalent to a pixel circuit to which the disconnection area of the second pixel circuit is connected.

15. The display panel of claim 9, wherein the repair circuit comprises:
a sub-storage capacitor connected between a first voltage line receiving a first power supply voltage and a reference node;
a first sub-transistor connected between the first voltage line and the repair line;
a second sub-transistor connected between a data line and a first input area of the first sub-transistor;
a third sub-transistor connected between the reference node and a first output area of the first sub-transistor;
a fourth sub-transistor connected between the reference node and a second voltage line receiving a first initialization voltage;
a fifth sub-transistor connected between the first voltage line and the first input area of the first sub-transistor;
a sixth sub-transistor connected between the repair line and the first output area of the first sub-transistor;
a seventh sub-transistor connected between a third voltage line receiving a second initialization voltage and the repair line; and
an eighth sub-transistor connected between a fourth voltage line receiving a third initialization voltage and the first input area of the first sub-transistor.

16. The display panel of claim 15, wherein the repair circuit further comprises:
a holding capacitor connected between the first voltage line and a first input area of the seventh sub-transistor; and
a ninth sub-transistor connected between a first output area of the sixth sub-transistor and the first input area of the seventh sub-transistor.

17. The display panel of claim 9, further comprising:
a first connection electrode disposed on the second gate, connected to the first output area of the silicon transistor and the bridge electrode, and electrically connected to the second light emitting element; and
a second connection electrode disposed on the first connection electrode and connected to the first connection electrode and the second light emitting element.

18. The display panel of claim 9, further comprising first, second, third, fourth, and fifth insulating layers sequentially disposed on the base layer, wherein the silicon semiconductor pattern of the silicon transistor is disposed between the base layer and the first insulating layer, the first gate of the silicon transistor is disposed between the first and second insulating layers, each of the light shielding pattern and the repair line of the oxide transistor is disposed between the second and third insulating layers, the oxide semiconductor pattern of the oxide transistor is disposed between the third and fourth insulating layers, each of the second gate of the oxide transistor and the bridge electrode is disposed between the fourth and fifth insulating layers, and a first connection electrode is disposed on the fifth insulating layer and is connected to the bridge electrode via a contact hole in the fifth insulating layer.

19. A display panel comprising:
a base layer comprising a display area and a non-display area;
a repair circuit disposed in the non-display area;
a pixel disposed in the display area and comprising a pixel circuit and a light emitting element; and
a repair line electrically connected to the repair circuit and extending from the repair circuit to the pixel, the pixel circuit comprising:
a silicon transistor comprising a silicon semiconductor pattern comprising a first input area, a first channel area, and a first output area and a first gate disposed on the silicon semiconductor pattern and overlapping the first channel area;
an oxide transistor comprising a light shielding pattern disposed on the first gate, an oxide semiconductor pattern disposed on the light shielding pattern and comprising a second input area, a second channel area, and a second output area, and a second gate disposed on the oxide semiconductor pattern, overlapping the second channel area, and disposed on a same layer as a layer on which the repair line is disposed; and
a connection electrode disposed on the second gate, overlapping the repair line, connected to the first output area of the silicon transistor, and electrically connected to the light emitting element, wherein the light emitting element is electrically connected to the silicon transistor of the pixel circuit or electrically connected to the repair circuit;

wherein the silicon semiconductor pattern of the silicon transistor and the oxide semiconductor pattern of the oxide transistor are disposed on different layers.

20. The display panel of claim 19, wherein the repair line is connected to the connection electrode when the light emitting element is electrically connected to the repair circuit.

* * * * *